US 8,307,314 B2

(12) United States Patent
Anpo

(10) Patent No.: US 8,307,314 B2
(45) Date of Patent: Nov. 6, 2012

(54) WRITE ERROR VERIFICATION METHOD OF WRITING APPARATUS AND CREATION APPARATUS OF WRITE ERROR VERIFICATION DATA FOR WRITING APPARATUS

(75) Inventor: Akihito Anpo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 266 days.

(21) Appl. No.: 12/787,907

(22) Filed: May 26, 2010

(65) Prior Publication Data

US 2010/0306721 A1  Dec. 2, 2010

(30) Foreign Application Priority Data

May 28, 2009 (JP) ................................. 2009-128525

(51) Int. Cl.
*G06F 17/50* (2006.01)
*G06F 9/455* (2006.01)
(52) U.S. Cl. ............................ 716/106; 716/50; 716/100
(58) Field of Classification Search .................... 716/50, 716/100, 106
See application file for complete search history.

(56) References Cited

U.S. PATENT DOCUMENTS

| | | | |
|---|---|---|---|
| 7,504,645 B2 | 3/2009 | Anpo et al. | |
| 7,530,049 B2 * | 5/2009 | Kobayashi et al. | 716/53 |
| 7,698,682 B2 | 4/2010 | Anpo et al. | |
| 2002/0116697 A1 * | 8/2002 | Okamoto et al. | 716/21 |
| 2009/0191317 A1 * | 7/2009 | Lin | 426/119 |
| 2010/0275154 A1 * | 10/2010 | Livnat | 715/802 |

FOREIGN PATENT DOCUMENTS

| | | |
|---|---|---|
| JP | 2007-242823 | 9/2007 |
| JP | 2008-47722 | 2/2008 |

* cited by examiner

*Primary Examiner* — Jack Chiang
*Assistant Examiner* — Magid Dimyan
(74) *Attorney, Agent, or Firm* — Oblon, Spivak, McClelland, Maier & Neustadt, L.L.P.

(57) ABSTRACT

A write error verification method of a writing apparatus verifying a write error after a write operation being started in the writing apparatus to which layout data containing a figure pattern to be formed is input and which forms the figure pattern on a target object based on the layout data input, the write error verification method includes: if a write error occurs in a process between input of the layout data into the writing apparatus and inspection of the target object on which the figure pattern is formed, selecting a part of the layout data necessary for operation of a function that has caused the write error; extracting parts of the layout data corresponding to a selected part of the layout data for all of a plurality of portions of the target object if a pattern indicated by the selected part of the layout data is arranged at the plurality of portions of the target object; creating verification data by deleting at least one parts extracted for at least one portions other than a portion that has caused the write error from extracted parts of the layout data and by using remaining data; and reproducing the operation of the function that has caused the write error using the verification data to output a result of the reproducing.

10 Claims, 28 Drawing Sheets

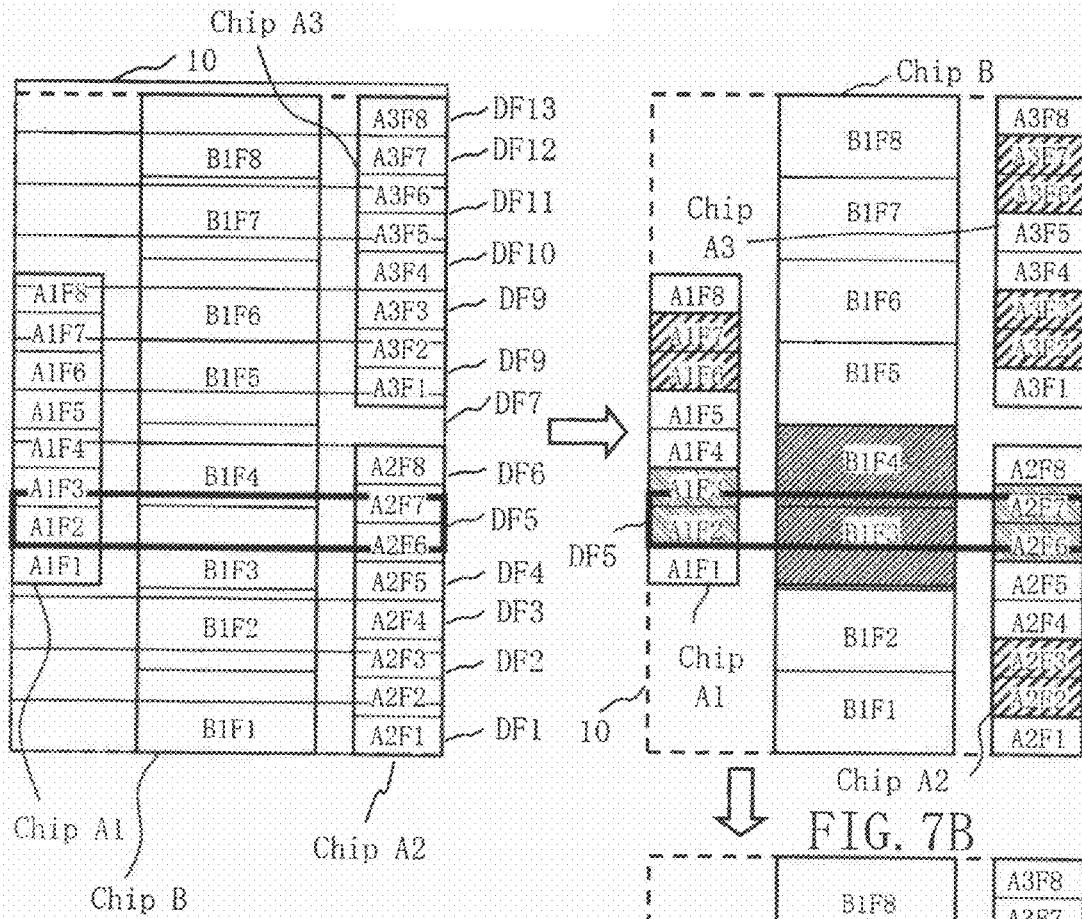
FIG. 7A
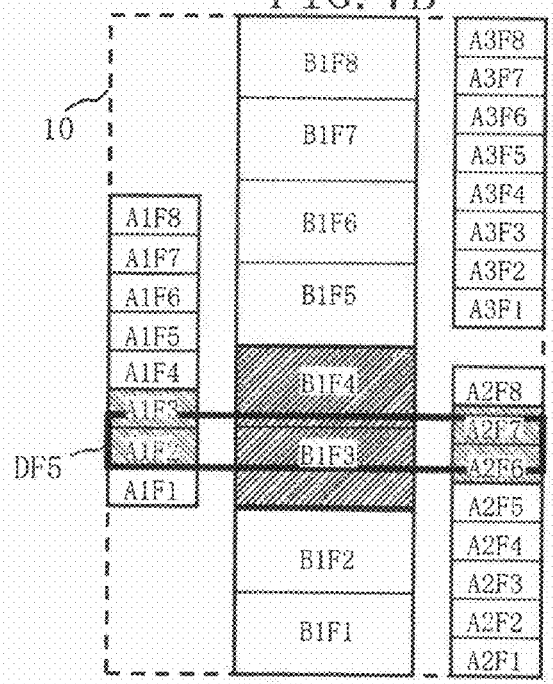
FIG. 7B
FIG. 7C

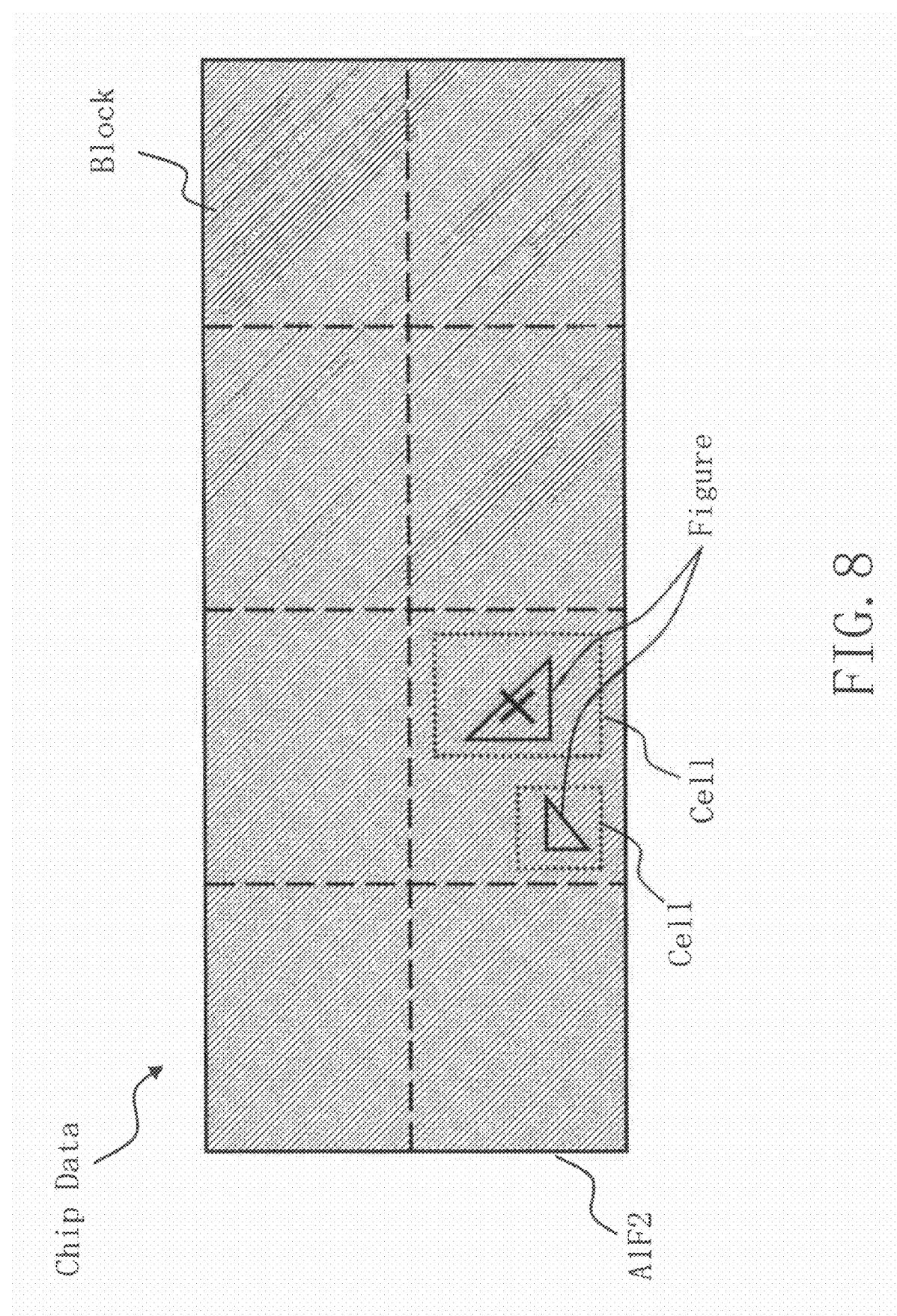

WRITE ERROR VERIFICATION METHOD OF WRITING APPARATUS AND CREATION APPARATUS OF WRITE ERROR VERIFICATION DATA FOR WRITING APPARATUS

CROSS-REFERENCE TO RELATED APPLICATION

This application is based upon and claims the benefit of priority from prior Japanese Patent Application No. 2009-128525 filed on May 28, 2009 in Japan, the entire contents of which are incorporated herein by reference.

BACKGROUND OF THE INVENTION

1. Field of the Invention

The present invention relates to an operation error verification method of a writing apparatus and a creation apparatus of operation error verification data for the writing apparatus, and for example, relates to an operation error verification method or a creation apparatus of verification data of an electron beam writing apparatus.

2. Related Art

A Lithography technique which takes a part of the development of miniaturization of semiconductor devices is only a process, in which a pattern is generated, in semiconductor manufacturing processes and is very important. In recent years, with the advancement in integration density of an LSI, circuit line widths required for semiconductor devices are miniaturized year by year. In order to form desired circuit patterns on the semiconductor devices, precise original patterns (to be also referred to as a reticle or a mask) are required. In this case, an electron beam writing technique has an essentially excellent resolution, and is used in production of precise original patterns.

FIG. 28 is a conceptual diagram for explaining an operation of a variable-shaped electron beam (EB) writing apparatus. The variable-shaped electron beam writing apparatus operates as follows. An oblong, for example, rectangular opening 411 to shape an electron beam 442 is formed in a first aperture plate 410. A variable-shaped opening 421 to shape the electron beam 442 having passed through the opening 411 of the first aperture plate 410 into a desired oblong shape is formed in a second aperture plate 420. The electron beam 442 irradiated from a charged particle source 430 and having passed through the opening 411 of the first aperture plate 410 is deflected by a deflector, passes through a part of the variable-shaped opening 421 of the second aperture plate 420, and is irradiated on a target object placed on a stage continuously moving in one predetermined direction (for example, an X direction). More specifically, an oblong shape which can pass through both the opening 411 of the first aperture plate 410 and the variable-shaped opening 421 of the second aperture plate 420 is written in a write region of a target object 440 placed on the stage continuously moving in the X direction. A scheme which causes an electron beam to pass through both the opening 411 of the first aperture plate 410 and the variable-shaped opening 421 of the second aperture plate 420 to form an arbitrary shape is called a variable-shaping scheme.

Upon such electron beam writing, firstly, a layout of a semiconductor integrated circuit is designed and layout data is generated. Then, data of chips satisfying certain conditions contained in the layout data are merged and the layout data is reconstructed. Then, the chip-merged layout data is converted to generate write data used by an electron beam writing apparatus. Further, a figure is divided into shot sizes for actual shots of the electron beam based on the write data, and then writing is performed.

Here, a write error may occur in a process between input of the layout data into the writing apparatus and inspection of the target object on which a figure pattern is formed. If a write error occurs after a writing apparatus starts to form a pattern, the simplest method of reproducing the error for examination is to use completely the same data. However, if the processing time from starting to form a pattern to reach to a portion that has caused the error is long, it takes a very long time to examine the error, unfortunately. Thus, the inventors have proposed to extract a part of layout data necessary for operation of the function causing a write error from the layout data, perform merge processing based on the part of the extracted layout data, and create verification data to verify the write error from the layout data after the merge processing (for example, see Published Unexamined Japanese Patent Application No. 2008-047722 (JP 2008-047722A). By performing a reproduction test using verification data created by automatically extracting a pattern at the portion of error occurrence in this manner, it becomes possible to reduce the examination time of errors.

However, if the same chip is arranged at a plurality of portions in a layout, a problem may arise with the technique according to the JP 2008-047722A alone. This is because generally only one piece of chip data is used as a basis and pieces of pattern data created by referring to the same chip data as a basis are arranged at respective portions. Thus, if verification data is created by automatically extracting pattern data at a portion of error occurrence, pieces of the pattern data regarding the portion corresponding to the portion of error occurrence are similarly arranged for chips arranged in other regions. Therefore, when a reproduction test is performed, the same test is also performed for portions other than the portion corresponding to error occurrence, posing a problem that loss of the verification time is caused.

In a layout in which the same chips are arranged at a plurality of portions, as described above, there is a problem that pieces of verification data are also created for portions other than a portion that has originally caused an error. Particularly for a layout in which the number of chip arrangements is large, verification is performed also for regions that originally need not be verified to waste verification time, and thus, it may take longer than the verification time that would have been originally needed, unfortunately.

BRIEF SUMMARY OF THE INVENTION

It is an object of the present invention to reduce an examination time of a write error.

In accordance with one aspect of the present invention, a write error verification method of a writing apparatus verifying a write error after a write operation being started in the writing apparatus to which layout data containing a figure pattern to be formed is input and which forms the figure pattern on a target object based on the layout data input, the write error verification method includes: if a write error occurs in a process between input of the layout data into the writing apparatus and inspection of the target object on which the figure pattern is formed, selecting a part of the layout data necessary for operation of a function that has caused the write error; extracting parts of the layout data corresponding to a selected part of the layout data for all of a plurality of portions of the target object if a pattern indicated by the selected part of the layout data is arranged at the plurality of portions of the target object; creating verification data by deleting at least one parts extracted for at least one portions other than a portion that has caused the write error from extracted parts of the layout data and by using remaining data; and reproducing the operation of the function that has caused the write error using the verification data to output a result of the reproducing.

In accordance with another aspect of the present invention, a creation apparatus for creating verification data to verify a write error after a write operation being started in a writing apparatus that forms a pattern on a target object based on layout data containing a figure pattern to be formed, includes: a selection unit configured to select a part of the layout data necessary for operation of a function that has caused the write error; a data extraction unit configured to extract parts of the layout data corresponding to a selected part of the layout data from the layout data for all of a plurality of portions of the target object if a pattern indicated by the selected part of the layout data is arranged at the plurality of portions of the target object; and a verification data creation unit configured to create verification data by deleting at least one parts extracted for at least one portions other than a portion that has caused the write error from among extracted parts of the layout data and by using remaining data.

BRIEF DESCRIPTION OF THE DRAWINGS

FIGS. 7A to 7C are diagrams exemplifying a layout configuration according to Embodiment 1.

FIG. 8 is a conceptual diagram showing an example in which an extraction unit is an entire frame specified by coordinate specification according to Embodiment 1.

DETAILED DESCRIPTION OF THE INVENTION

In embodiments described below, a charged particle beam writing apparatus will be described as an example of the writing apparatus and particularly, a configuration using an electron beam as an example of the charged particle beam will be described.

However, the charged particle beam is not limited to the electron beam and a beam using other charged particles such as an ion beam may also be used.

Embodiment 1

Figure 1:
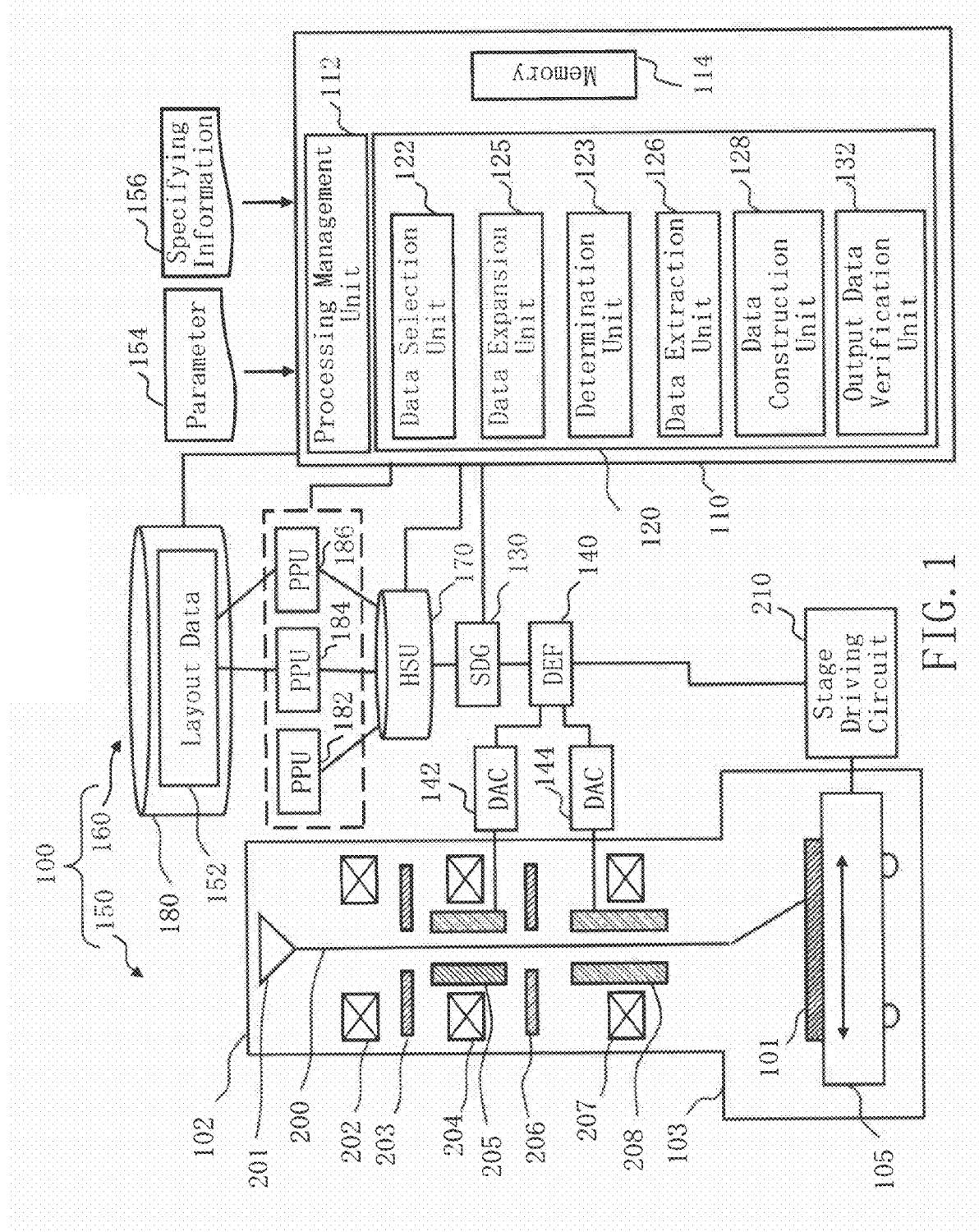
FIG. 1 is a conceptual diagram showing the configuration of a writing apparatus according to Embodiment 1.

FIG. 1 is a conceptual diagram showing a configuration of a writing apparatus according to Embodiment 1. In FIG. 1, a writing apparatus 100 includes a write unit 150 and a control unit 160. The writing apparatus 100 is an example of the charged particle beam writing apparatus. The writing apparatus 100 forms, "writes", or "draws" a pattern onto a target object 101. Layout data containing a figure pattern to be formed is input in the writing apparatus 100. The writing apparatus 100 forms the figure pattern on the target object 101 based on the layout data input. The write unit 150 has an electron lens barrel 102 and a write chamber 103. The control unit 160 has a writing control unit (WCU) 110, a shot data generating unit (SDG) 130, a deflection control circuit (DEF) 140, a digital-analog converter (DAC) 142, a DAC 144, a high-speed shared storage unit (HSU) 170, a data storage unit (DSU) 180, a parallel processing unit (PPU) 182, a PPU 184, a PPU 186, and a stage driving circuit 210.

The writing control unit 110 has a processing management unit 112, a memory 114, and an evaluation data creation unit 120 (an example of the creation apparatus of operation error verification data of the writing apparatus 100). In the evaluation data creation unit 120, the writing control unit 110 also has a data selection unit 122, a determination unit 123, a data expansion unit 125, a data extraction unit 126, a data construction unit 128, and an output data verification unit 132. Here, as an example, the evaluation data creation unit 120 is realized by a control computer constituting a computer and has respective functions including the data selection unit 122, the determination unit 123, the data expansion unit 125, the data extraction unit 126, the data construction unit 128, and the output data verification unit 132. Input data, output data and the like calculated by the evaluation data creation unit 120 are stored in the memory 114. It is not limited that respective functions including the data selection unit 122, the determination unit 123, the data expansion unit 125, the data extraction unit 126, the data construction unit 128, and the output data verification unit 132 are realized by software executed by a computer and may be realized by hardware with an electric circuit. Alternatively, respective functions may be realized by a combination of hardware with an electric circuit and software. Or, respective functions may be realized by a combination of such hardware and firmware. Moreover, the processing management unit 112 may also be realized by a control computer constituting a computer.

Although not illustrated, the shot data generating unit 130, the PPU 182, the PPU 184, and the PPU 186 has a CPU constituting a computer.

The shot data generating unit 130, the high-speed shared storage unit 170, the data disk unit 180, the PPU 182, the PPU 184, and the PPU 186 are connected to the writing control unit 110 via a bus. In addition to the writing control unit 110, the deflection control circuit 140 and the high-speed shared storage unit 170 are connected to the shot data generating unit 130 via the bus. The DAC 142, the DAC 144, and the stage driving circuit 210 are connected to the deflection control circuit 140 via the bus. The DAC 142 is connected to a deflector 205 and the DAC 144 to a deflector 208. In the data disk unit 180, layout data 152 including a plurality of pieces of chip data which are input from a customer server apparatus and on which chip-merge processing is not performed are stored.

In the electron lens barrel 102, an electron gun assembly 201, an illumination lens 202, a first aperture plate 203, a projection lens 204, the deflector 205, a second aperture plate 206, an objective lens 207, and the deflector 208 are arranged. In the write chamber 103, an XY stage 105 is arranged. A target object 101 as a write target is placed on the XY stage 105. For example, a mask substrate coated with a resist may be the target object 101. In FIG. 1, a part except for a configuration part required for explaining Embodiment 1 are not shown. The writing apparatus 100 generally includes other necessary configurations as a matter of course. Three parallel processing units (PPUs) are shown in FIG. 1, but the number of the units is not limited as long as at least one unit is included.

An electron beam 200 emitted from the electron gun assembly 201 as an example of the charged particle beam illuminates the entire first aperture plate 203 having an oblong, for example, rectangular hole by the illumination lens 202. In this case, the electron beam 200 is shaped into an oblong, for example, a rectangular shape first. The electron beam 200 of a first aperture plate image having passed through the first aperture plate 203 is projected on the second aperture plate 206 by the projection lens 204. A position of the first aperture plate image on the second aperture plate 206 is deflection-controlled by the deflector 205 controlled by the deflection control circuit 140 via the DAC 142 to make it possible to change a beam shape and a beam size. The electron beam 200 of the second aperture plate image having passed through the second aperture plate 206 is focused by the objective lens 207 and deflected by he deflector 208 controlled by the deflection control circuit 140 via the DAC 144 so as to be irradiated to a desired position of the target object 101 on the XY stage 105 movably arranged and controlled by the stage driving circuit 210.

The electron lens barrel 102 and the write chamber 103 are vacuumed by a vacuum pump (not shown) to be set in a vacuum atmosphere having a pressure lower than the atmospheric pressure.

Then, The writing control unit 110, particularly the processing management unit 112, controls respective unit apparatuses including the shot data generating unit 130, the high-speed shared storage unit 170, the data disk unit 180, the PPU 182, the PPU 184, and the PPU 186 so as to control the entire writing apparatus 100.

Figure 2:
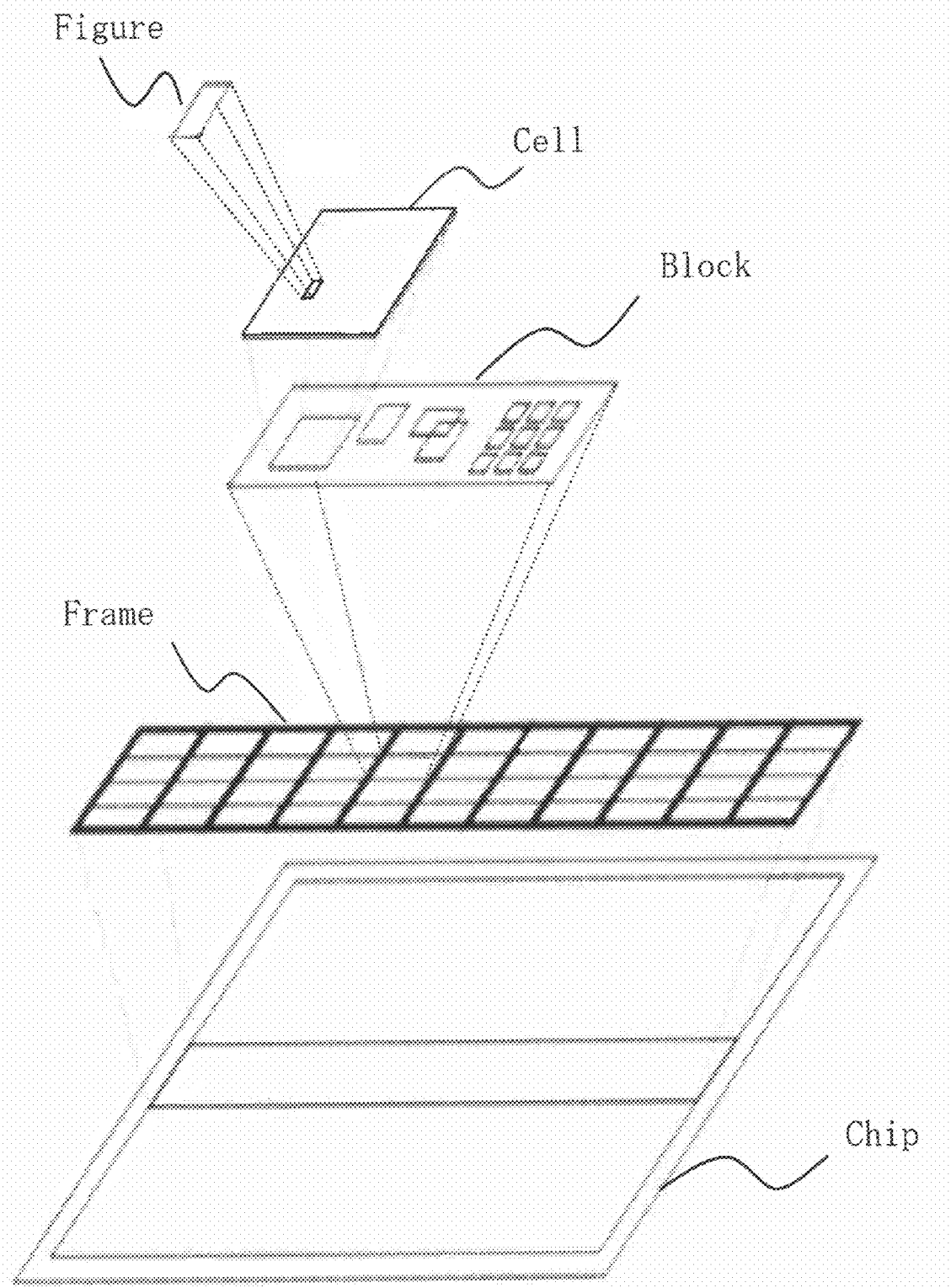
FIG. 2 is a diagram showing an example of hierarchical structure of layout data.

FIG. 2 is a diagram showing an example of a hierarchical structure of layout data. In each piece of chip data contained in the layout data, a write region is hierarchized into a plurality of internal constitutional units in series including a chip hierarchy, a frame hierarchy which is obtained by dividing a chip region, for example, in the y direction into thin rectangular regions, a block hierarchy obtained by dividing a frame, a cell hierarchy constituted by at least one figure, and a figure hierarchy including a figure pattern constituting the cell. It is general that a plurality of chip hierarchies are laid out for a write region of one target object 101.

Figure 3:
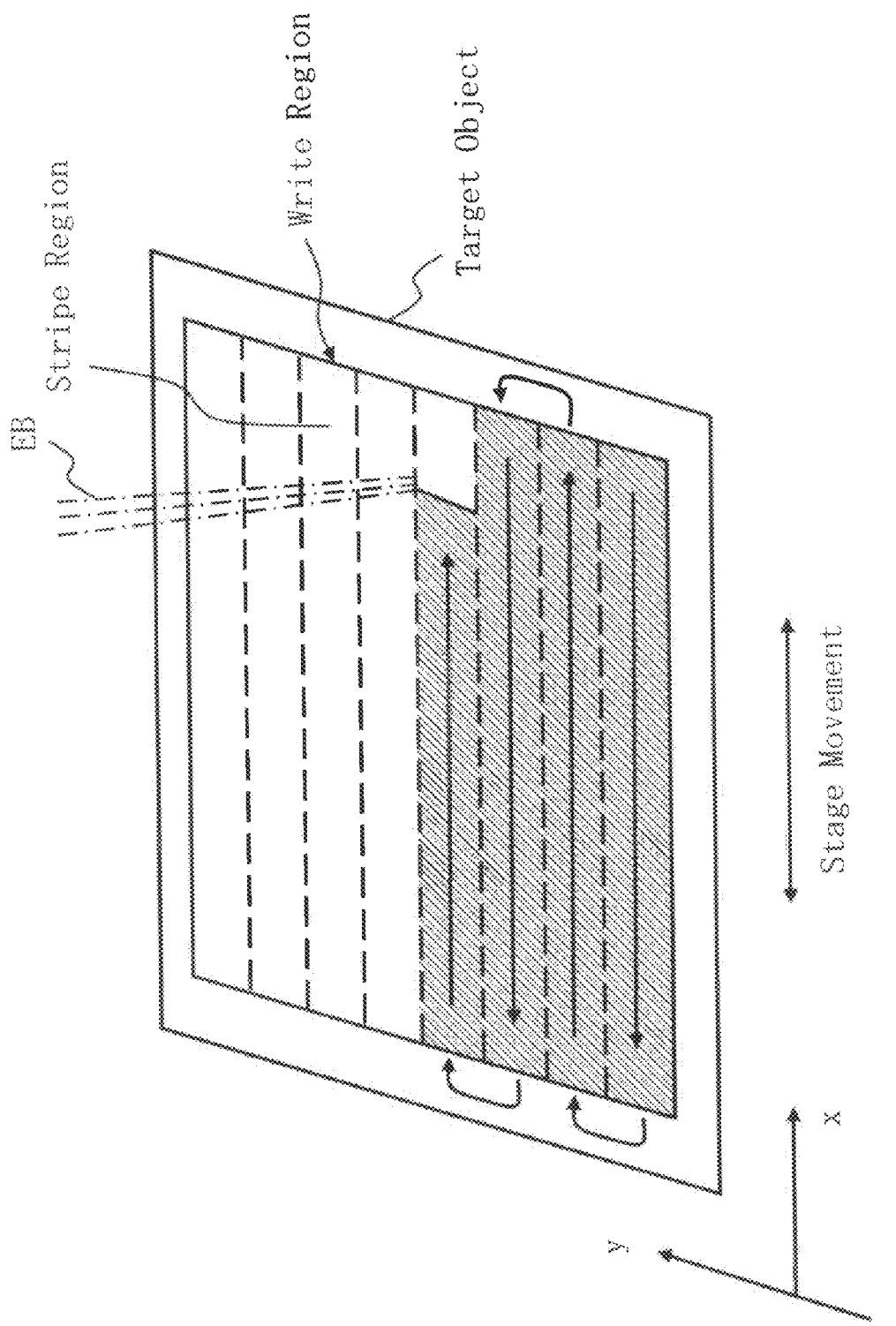
FIG. 3 is a diagram for explaining how a stage moves according to Embodiment 1.

FIG. 3 is a diagram for explaining how a stage moves according to Embodiment 1. Upon forming a pattern on the target object 101, the electron beam 200 is irradiated on one stripe region of the target object 101 which is obtained by virtually dividing a writing surface (exposure surface) into a plurality of stripe regions in a thin rectangular shape and to which the electron beam 200 can be deflected while moving the XY stage 105 continuously in, for example, the X direction. Movement of the XY stage 105 in the X direction is set, for example, to be continuous and at the same time, the shot position of the electron beam 200 is caused to follow the stage movement. The writing time can be reduced by setting the movement to be continuous. Then, when write operation on one stripe region is completed, the XY stage 105 is moved in steps in the Y direction to perform a write operation in the X direction (this time, in the opposite direction) on the next stripe. The movement time of the XY stage 105 can be reduced by performing the write operation on each stripe region while advancing the XY state 105 like a serpentine movement.

Thus, in order for the writing apparatus 100 to write figure patterns of each chip region contained in the layout data 152, merge processing of a plurality of chips contained in the layout data 152 are performed and then, the layout data 152 is again virtually divided into write frame regions (the above stripe regions) on which patterns are formed by the writing apparatus 100. The layout data 152 is converted into write data used by the writing apparatus 100 to form a pattern and further converted into shot data, and then a shot is actually performed.

Figure 4:
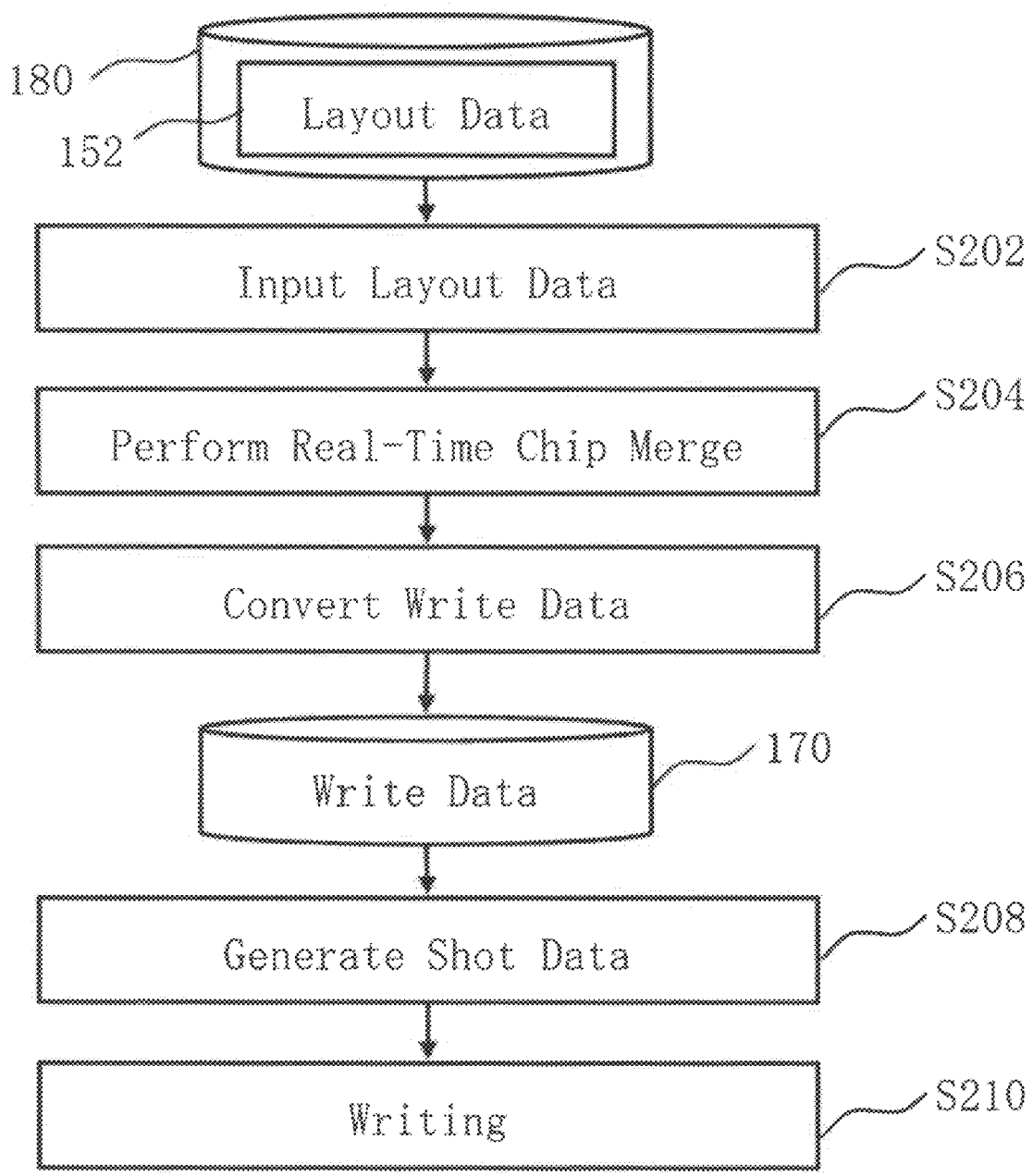
FIG. 4 is a flow chart showing main steps of a flow up to forming a pattern according to Embodiment 1.

FIG. 4 is a flow chart showing main steps of a flow up to forming a pattern according to Embodiment 1. As shown in FIG. 4, in a writing method according to Embodiment 1, a series of steps including a layout data input step (S202), real-time chip merge (RTCM) processing step (S204), write data converting step (S206), shot data generating step (S208), and writing step (S210).

First, the PPU 182, the PPU 184, and the PPU 186 each reads the layout data 152 stored in the data disk unit 180 in frames of each chip and input the data thereinto under the control of the processing management unit 112 (S202). Then, each calculation unit of the PPU 182, the PPU 184, and the PPU 186 performs chip merge processing of the input data by parallel processing in real time (S204). Further, each calculation unit of the PPU 182, the PPU 184, and the PPU 186 converts the data obtained by the chip merge processing in parallel processing into write data and then output the data to the high-speed shared storage unit 170 (S206). The high-speed shared storage unit 170, which serves as a buffer memory, temporarily stores write data converted successively in real time. Data that has read is deleted. When data for one write frame to form a pattern is accumulated in the high-speed shared storage unit 170, the shot data generating unit 130 reads the write data for one write frame from the high-speed shared storage unit 170 to generate shot data (S208). Then, according to the generated shot data, the deflection control circuit 140 changes the beam shape and size by deflection control of the deflector 205 via the DAC 142. The deflection control circuit 140 also performs deflection control of the deflector 208 via the DAC 144 to irradiate the electron beam 200 onto a desired position of the target object 101 on the XY stage 105 (S210).

In the steps of flow from input of layout data to formation of a pattern in the writing apparatus 100, a write data conversion error by each calculation unit of the PPU 182, the PPU 184, and the PPU 186, a shot data generation error by the shot data generating unit 130, a deflection control error in actual formation of a pattern by the deflection control circuit 140, or an operation error of function such as a tracking overflow by the stage driving circuit 210 may occur. The write error includes an error stop of the writing apparatus 100 due to such software or hardware as well as a pattern error and the like detected by an inspection apparatus after a pattern is formed by the writing apparatus 100.

Thus, the present embodiment is configured so that if a write error occurs in operation of a function of the writing apparatus 100 in a process from input of the layout data 152 into the writing apparatus 100 to inspection of the target object 101 on which a figure pattern is formed, minimum data necessary to perform a reproduction test is obtained to reduce the examination time. The minimum data is data after real-time chip merge processing in a predetermined range containing an error portion. That is, a write error of the writing apparatus is verified by extracting a part of layout data necessary for operation of the function that has caused the write error from the layout data 152 that has caused the error and creating evaluation data (verification data) based on the extracted part of layout data to reproduce the operation of the function that has caused the error.

The minimum data necessary for reproduction of the operation of the function varies depending on the portion where a write error occurs. If the above examples are referenced, in write data conversion processing, for example, only data of a figure that has actually caused a conversion error is needed. In shot data generation processing, for example, only data for one write frame containing a portion that has caused an error is needed. Only with the data for one write frame, the stage speed can be calculated. In deflection control processing during actual formation of a pattern, for example, only data for one write frame containing the portion that has caused an error is needed. This is because, since the write operation is performed while moving the XY stage 105 for each write frame (stripe) as described above, it is necessary to retry for each of write frames if an error occurs in a deflection position during actual formation of a pattern. Also when, for example, a tracking overflow occurs, the pattern area density is needed to calculate the stage speed and thus, data for one write frame containing the portion that has caused an error is likewise needed. Also when a pattern error is detected by an inspection apparatus after a pattern is formed, it is necessary to retry for each of write frames and thus, data for one write frame containing the portion that has caused an error is needed.

The layout data 152 is, as described above, hierarchized into a plurality of internal constitutional units such as a chip hierarchy, a frame hierarchy, a block hierarchy, a cell hierarchy, and a figure hierarchy and thus, necessary data containing the portion that has caused an operation error may be extracted from the layout data 152 as a plurality of internal constitutional units (a part of the layout data) to create evaluation data.

Figure 5:
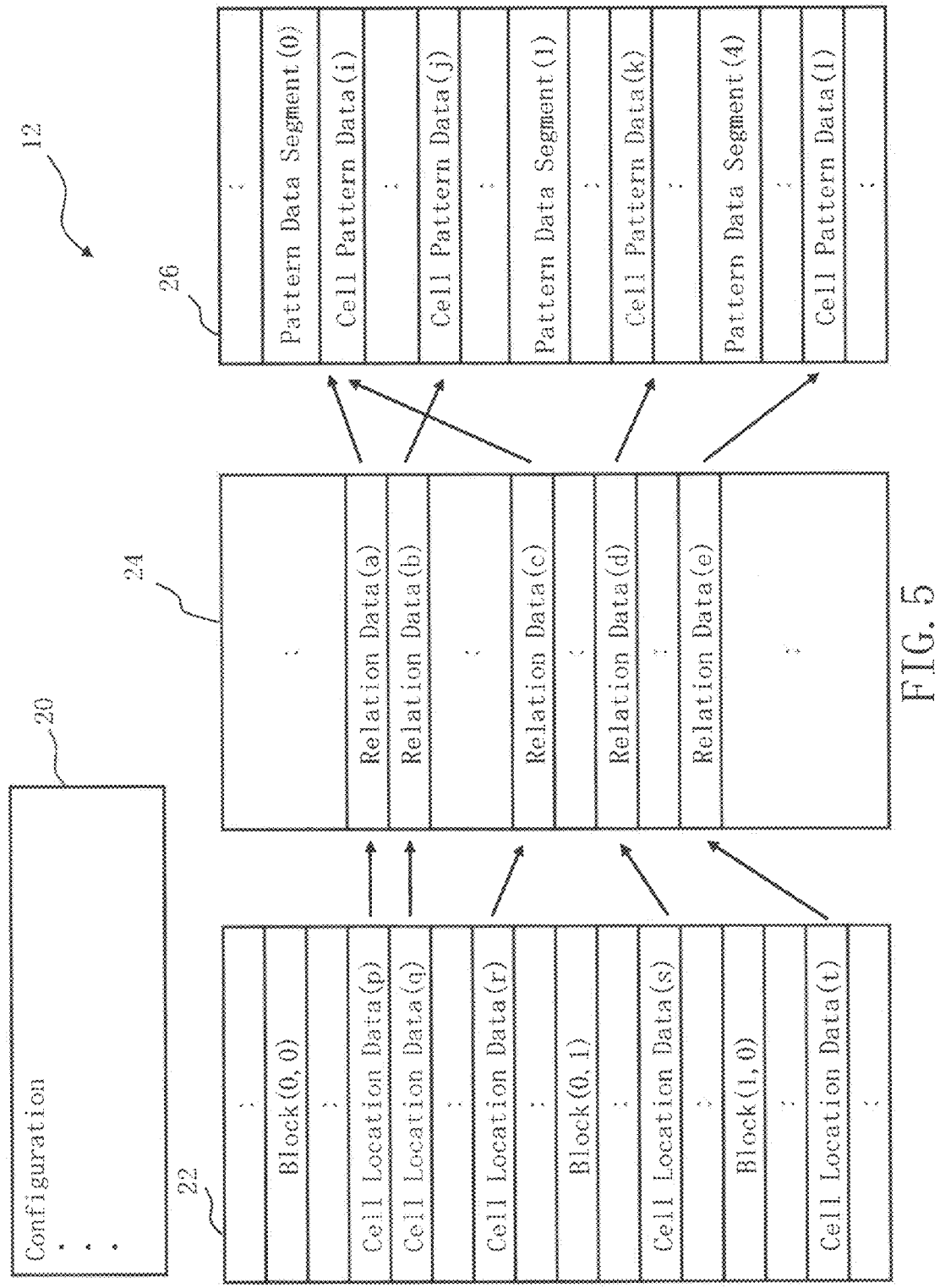
FIG. 5 is a diagram showing an example of the layout data according to Embodiment 1.

FIG. 5 is a diagram showing an example of the layout data according to Embodiment 1. In FIG. 5, as an example, cell location data, link data, and cell pattern data created for some chip of a plurality of chips are shown. When a plurality of chips are arranged, cell location data, link data, and cell pattern data are created for each piece of chip data as a matter of course. In FIG. 5, layout data 12 has, as an example, a cell location data file 22, a link data file 24, and a cell pattern data file 26 of some chip. The layout data 12 further has a layout configuration file 20 indicating the arrangement configuration of a plurality of chips.

The cell location data file 22 contains arrangement data (arrangement information) to arrange a cell of some chip contained in the layout data 12. The cell location data file 22 contains pieces of arrangement data for arranging some cells, for example, for each frame or block region. In FIG. 5, as an example, pieces of arrangement data for arranging respective ones of cells (p) to (t) as a part of cells to be arranged are shown. The cell location data is represented by coordinates or the like that indicate the arrangement position of the reference point of a cell. In FIG. 5, the cell location data file 22, includes a file header and sequentially defines (stores) a block (0, 0) header, a piece of cell location data (p), a piece of cell location data (q), and cell location data (r) arranged in the block (0, 0), a block (0, 1) header, a piece of cell location data (s) arranged in the block (0, 1), a block (1, 0) header, and a piece of cell location data (t) arranged in the block (1, 0). Then, other pieces of arrangement data are further stored.

Next, the cell pattern data file 26 contains pieces of pattern data of a plurality of cells arranged in some chip. In FIG. 5, as an example, pieces of pattern data of the cells (i) to (l) are shown. Here, the cell pattern data file 26 stores, as a part thereof, a pattern data segment (0), a piece of cell pattern data (i) indicating pattern data of the cell (i), and a piece of cell pattern data (j) indicating pattern data of the cell (j) each once. Sequentially, a pattern data segment (1) and a piece of cell pattern data (k) indicating pattern data of the cell (k) are stored. Further, other data is stored and sequentially, a pattern data segment (4) and a piece of cell pattern data (l) indicating pattern data of the cell (l) are stored.

The link data file 24 contains link information to refer to each piece of cell pattern data from each piece of cell location data and pieces of operation information for pieces of cell pattern data. In FIG. 5, in the link data file 24, a piece of relation data (a) to associate the piece of cell location data (p) with the piece of cell pattern data (i), a piece of relation data (b) to associate the piece of cell location data (q) with the piece of cell pattern data (j), a piece of relation data (c) to associate the piece of cell location data (r) with the piece of cell pattern data (i), a piece of relation data (d) to associate cell the piece of location data (s) with the piece of cell pattern data (k), and a piece of relation data (e) to associate the piece of cell location data (t) with the piece of cell pattern data (l) are stored as a part thereof together with other data.

In the layout configuration file 20, coordinates in the write region of the target object 101 where each chip is arranged are defined.

Figure 6:
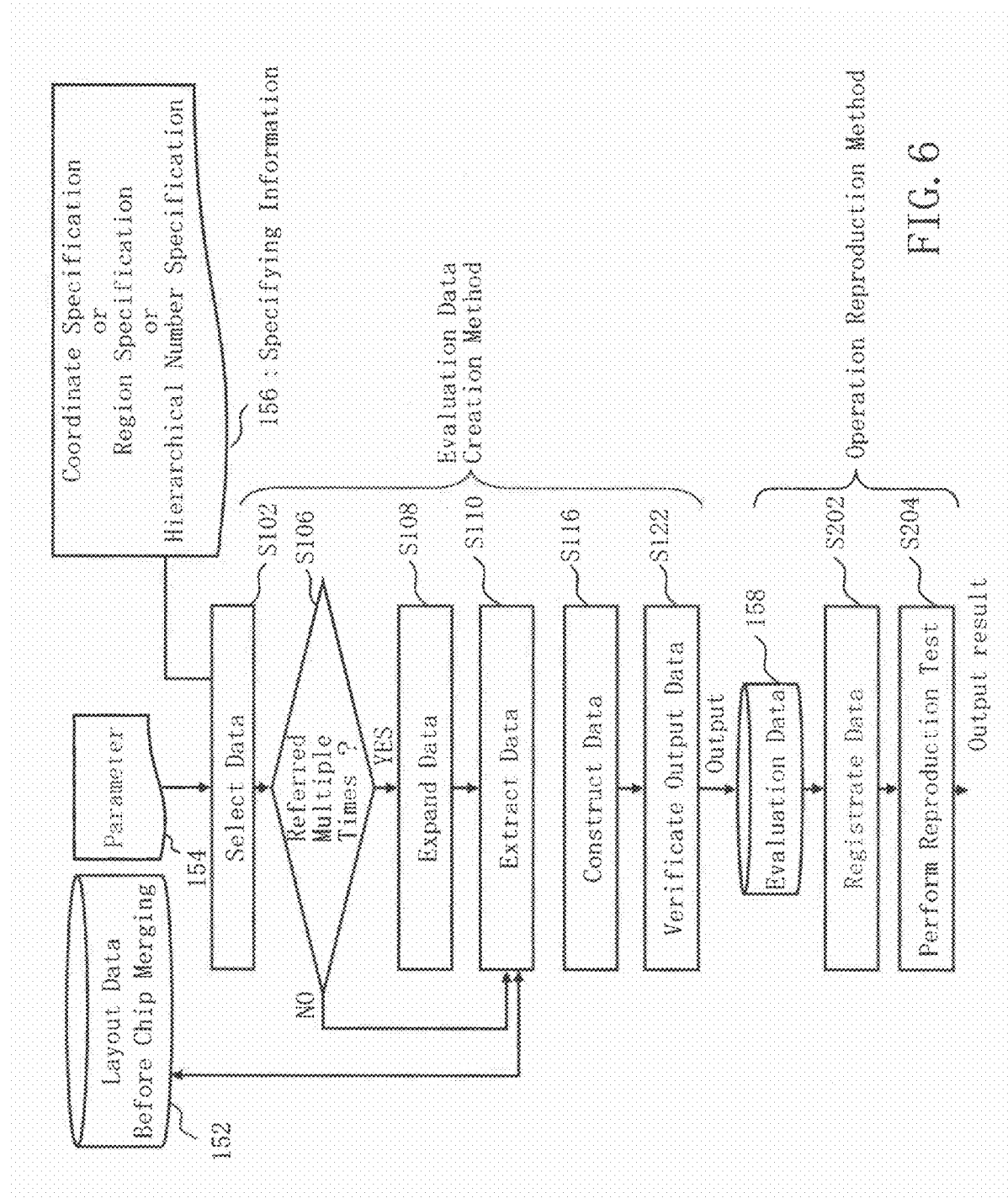
FIG. 6 is a flow chart showing main steps of an evaluation data creation method and an operation reproduction method according to Embodiment 1.

FIG. 6 is a flow chart showing main steps of an evaluation data creation method and an operation reproduction method according to Embodiment 1. In FIG. 6, in the evaluation data creation method, which is an example of the creation method of write error verification data by the writing apparatus, performs a series of steps including a data selection step (S102), determination step (S106), data expansion step (S108), data extraction step (S110), data construction step (S116), and output data verification step (S122). Then, using the output evaluation data, the operation reproduction method performs a series of steps including a data registration step (S202) and reproduction test step (S204).

In S (step) 102, as the data selection step, if a write error occurs in a process between input of the layout data 152 into the writing apparatus 100 and inspection of the target object 101 on which a desired figure pattern is formed, the data selection unit 122 selects a part of the layout data 152 necessary for the operation of the function that has caused the error.

FIGS. 7A to 7C are diagrams showing an example of a layout configuration according to Embodiment 1. FIG. 7A shows an example in which a chip A and a chip B are arranged in a write region 10 of the target object 101. Here, the chip A is arranged at three portions (a plurality of portions) denoted by A1, A2, and A3. When a pattern is formed, as described above, the chips A1, A2, and A3 and the chip B are arranged in the write region 10 and then, merge processing is performed as if one chip is arranged in the write region 10. Then, the write region 10 is virtually divided into a plurality of write frames (DF) in a thin rectangular shape serving as the write unit. In the example in FIG. 7A, for example, a write frame denoted by DF5 is shown as a write frame containing an error portion. Then, data of a frame region denoted by A1F2 and a frame region denoted by A1F3 across the write frame denoted by DF5 in the chip A1 are needed as a part of the layout data 152. Similarly, data of a frame region denoted by B1F3 and that denoted by B1F4 in the chip B across the write frame will be needed as a part of the layout data 152. Moreover, data of a frame region denoted by A2F6 and that denoted by A2F7 in the chip A2 across the write frame will be needed as a part of the layout data 152.

Therefore, the data selection unit 122 selects each of the pieces of frame data denoted by A1F2, A1F3, B1F3, B1F4, A2F6, and A2F7.

Data in a unit of frame of respective chips is selected here, but the unit of selection depends on specifying information 156. The data selection unit 122 to which the specifying information 156 is input retrieves information to specify data of which hierarchy should be selected from the specifying information 156. Here, the specifying information 156 includes, for example: coordinates specifying information of a plurality of internal constitutional units such as the chip hierarchy, frame hierarchy, block hierarchy, cell hierarchy, and figure hierarchy; region specifying information specifying a predetermined region; and hierarchical number specifying information (an example of identifier specifying information) specifying the hierarchical number (identifier) set to each internal configuration of a plurality of internal constitutional units such as the chip hierarchy, frame hierarchy, block hierarchy, cell hierarchy, and figure hierarchy. Data necessary for verification of an operation error is specified from data contained in the layout data 152 by using at least one of the coordinate specifying information, region specifying information, and hierarchical number specifying information. In the example in FIG. 7A, a case where pieces of frame data of each chip across the write frame denoted by DF5 is specified by the specifying information 156 to verify the entire write frame denoted by DF5. In the layout data 152 stored in the data disk unit 180, a plurality of pieces of chip data are stored and a piece of chip data is selected based on parameter information 154. In the parameter information 154, layout configuration data of each chip and the like is stored and when an error portion is input from the PPU 182, 184, or 186, a corresponding piece of chip data can be selected by referring to the parameter information 154 based on input coordinates or the like.

In S106, as the determination step, the determination unit 123 determines whether a pattern indicated by each piece of frame data denoted by A1F2, A1F3, B1F3, B1F4, A2F6, and A2F7 that have selected is arranged at a plurality of portions of the target object 101. As shown in FIG. 7B, the patterns indicated by the pieces of frame data denoted by A1F2 and A1F3 are also arranged in the frame denoted by A2F2 and A2F3 of the chip A2. Similarly, the patterns are also arranged in the frame denoted by A3F2 and A3F3 of the chip A3. The same chip is arranged at three portions and thus, the portion selected in A1 naturally has corresponding portions generated in A2 and A3. The patterns indicated by the pieces of frame data denoted by A2F6 and A2F7 are also arranged in the frame denoted by A1F6 and A1F7 of the chip A1. Similarly, the patterns are also arranged in the frame denoted by A3F6 and A3F7 of the chip A3. If the same chip is arranged at a plurality of portions, as described above, the process proceeds to the data expansion step (S108). In other word, if the same chip is referred multiple times, as described above, the process proceeds to the data expansion step (S108). If the same chip is not arranged at a plurality of portions, the process proceeds to the data extraction step (S110). In other word, if the same chip is not referred multiple times, the process proceeds to the data extraction step (S110).

In S108, as the data expansion step, the data expansion unit 125 expands data in each of the frame denoted by A1F2, A1F3, B1F3, B1F4, A2F6, and A2F7 that have been selected, and the frame denoted by A2F2 and A2F3 of the chip A2 arranged, and the frame denoted by A3F2 and A3F3 of the chip A3 that are other portions on which the same patterns. Here, the data expansion is performed on information of the reference position of each frame is expanded. The reference position of each frame may be defined, for example, by the position of the lower left corner of each frame. Or, the data expansion may be performed on information of the arrangement position of each cell arranged in each frame.

In S110, as the data extraction step, the data extraction unit 126 extracts, parts of the layout data 152 corresponding to a selected part of the layout data 152 for all of a plurality of portions of the target object 101 if a pattern indicated by the selected part of the layout data 152 is arranged at the plurality of portions of the target object 101. In other word, the data extraction unit 126 extracts each piece of frame data regarding all corresponding portions from the layout data 152 as a part of the layout data. Since the layout data is hierarchized into each of a plurality of internal constitutional units, as described above, the data extraction unit 126 extracts data of one of the plurality of internal constitutional units containing the portion that has caused a write error. Thus, the evaluation data creation unit 120 inputs specifying information specifying a part of layout data necessary for operation of the function that has caused a write error and the data extraction unit 126 extracts a part of the layout information specified by the specifying information from the layout information.

Here, a piece of cell pattern data of each cell arranged in each frame is extracted. If verification data is created directly, write data of regions other than DF5 will also be created. Therefore, in Embodiment 1, verification data is constructed as follows.

In S116, as the data construction step, the data construction unit 128, which is an example of the verification data creation unit, deletes portions other than the portion that have caused the write error from the pieces of frame data that have been extracted. Then, the data construction unit 128 performs chip-merge processing using each piece of frame data extracted regarding the portion that has caused the write error to reconstruct layout data. Then, the data construction unit 128 creates evaluation data 158 used as operation error verification data of the writing apparatus 100 from the reconstructed layout data. At this time, a data portion that is not extracted may be handled as null data having no data. Also, portions where frame data is deleted are handled as null data having no data. No pattern information is defined in the null data. In this manner, as shown in FIG. 7C, the data construction unit 128 creates the evaluation data 158 in which substantial data is present only in a frame portion across DF5. By configuring the layout data as described above, even if the same chip is arranged at a plurality of portions, excessive data at portions other than the portion that has caused an error can be prevented from being extracted.

In S122, as the output data verification step, the output data verification unit 132 verifies validity of the created evaluation data 158. The output data verification unit 132 verifies, for example, whether the data format is appropriate. Then, the output data verification unit 132 outputs the evaluation data 158 to an output location preset in the parameter information 154. At the same time, the output data verification unit 132 outputs a log file concerning evaluation data creation to a log file output location preset in the parameter information 154 with a log file name preset in the parameter information 154.

The evaluation data creation unit 120 is arranged in the writing control unit 110, but the arrangement location is not limited to this. The evaluation data creation unit 120 may be arranged anywhere as long as the data disk unit 180 is accessible. For example, the evaluation data creation unit 120 may be arranged outside the writing apparatus 100.

Then, the operation of the writing apparatus 100 is reproduced using the output evaluation data 158.

In S202, as the data registration step, the processing management unit 112 registers the evaluation data 158 output from the evaluation data creation unit 120.

In S204, as the reproduction test step, the operation of the function that has caused an operation error is reproduced. The reproduction test may be dummy writing in which only calculation processing without irradiation of an electron beam or may be actual writing in which a pattern of a region that causes to reproduce the error is formed on a target object for verification using an electron beam. A result of the reproducing is output to the data storage unit 180, the memory 114, a monitor, or a printer, (not shown), etc, for example.

In Embodiment 1, as described above, a write error that occurred in the writing apparatus 100 forming a pattern on the target object 101 based on the layout data 152 containing a figure pattern to be formed after the writing apparatus 100 starts to form a pattern is verified by using the created verification data 158.

Thus, the verification data 158 is created by collecting (extracting) only a relevant part (a part of the layout data 152) from the layout data 152, and using only a part that is definitely needed (a part of the layout data 152 to the extent necessary for operation of the portion that has caused an error) thereof. Thus, the amount of consumption of media such as a disk (for example, a flexible disk, CD-ROM, DVD-ROM, and tape) as a destination of the collection can be reduced.

Further, since there is no need to collect all the layout data 152, the collection time can be reduced.

Further, when data that needs to be verified by a manufacturer such as a writing apparatus manufacturer is transferred by FTP (File Transfer Protocol), there is no need to transfer all the layout data 152, so that the transfer time can be reduced.

Further, when the evaluation data 158 is created, data conversion of only a local region is needed, so that MTTR (Mean Time to Repair) can be reduced (the debugging time can be reduced).

Further, it is necessary for a user of the writing apparatus to disclose data of only a local region so that risks of information leakage can be reduced.

Here, a case where coordinate specification (or point specification) of a position which caused an error (denoted by X in FIG. 8) is carried out using coordinates (or a point) as the above specifying information 156 will be described.

FIG. 8 is a conceptual diagram showing an example in which an extraction unit is an entire frame by coordinate specification according to Embodiment 1.

In FIG. 8, a case where the entire frame containing the specified coordinates is extracted is shown. Here, an example in which the specified coordinate position is present in a frame 2 (A1F2) of the chip A1 and thus, the frame A1F2 of the chip A1 is set as an extraction region is shown.

Figure 9:
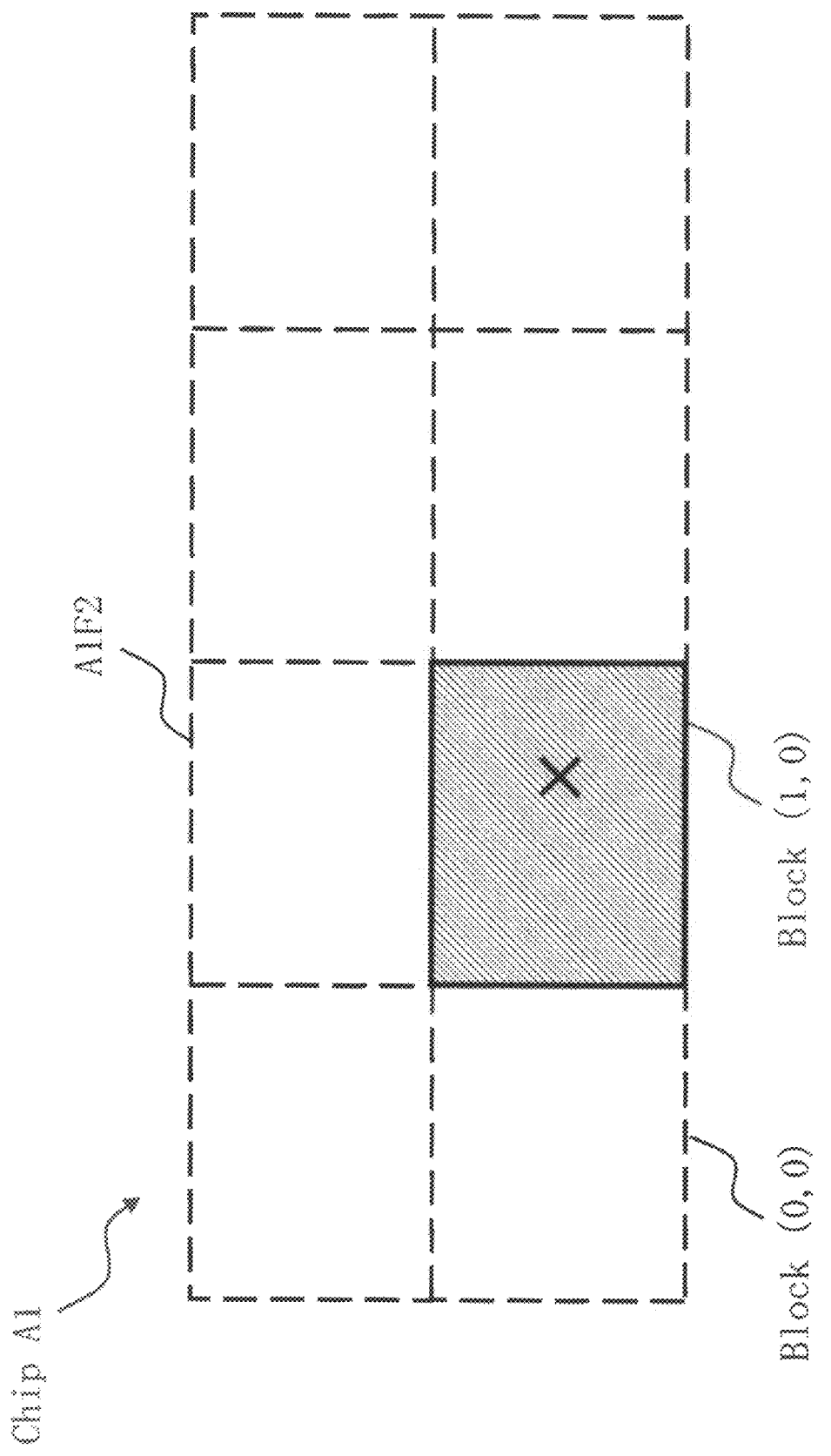
FIG. 9 is a conceptual diagram showing an example in which an extraction unit is a block specified by the coordinate specification according to Embodiment 1.

FIG. 9 is a conceptual diagram showing an example in which an extraction unit is a block specified by coordinate specification according to Embodiment 1.

In FIG. 9, a case where a block containing the specified coordinates is extracted is shown. Here, an example in which the specified coordinate position is present in a block (1, 0) in the frame A1F2 of the chip A1 and thus, the block (1, 0) is set as an extraction region is shown.

Figure 10:
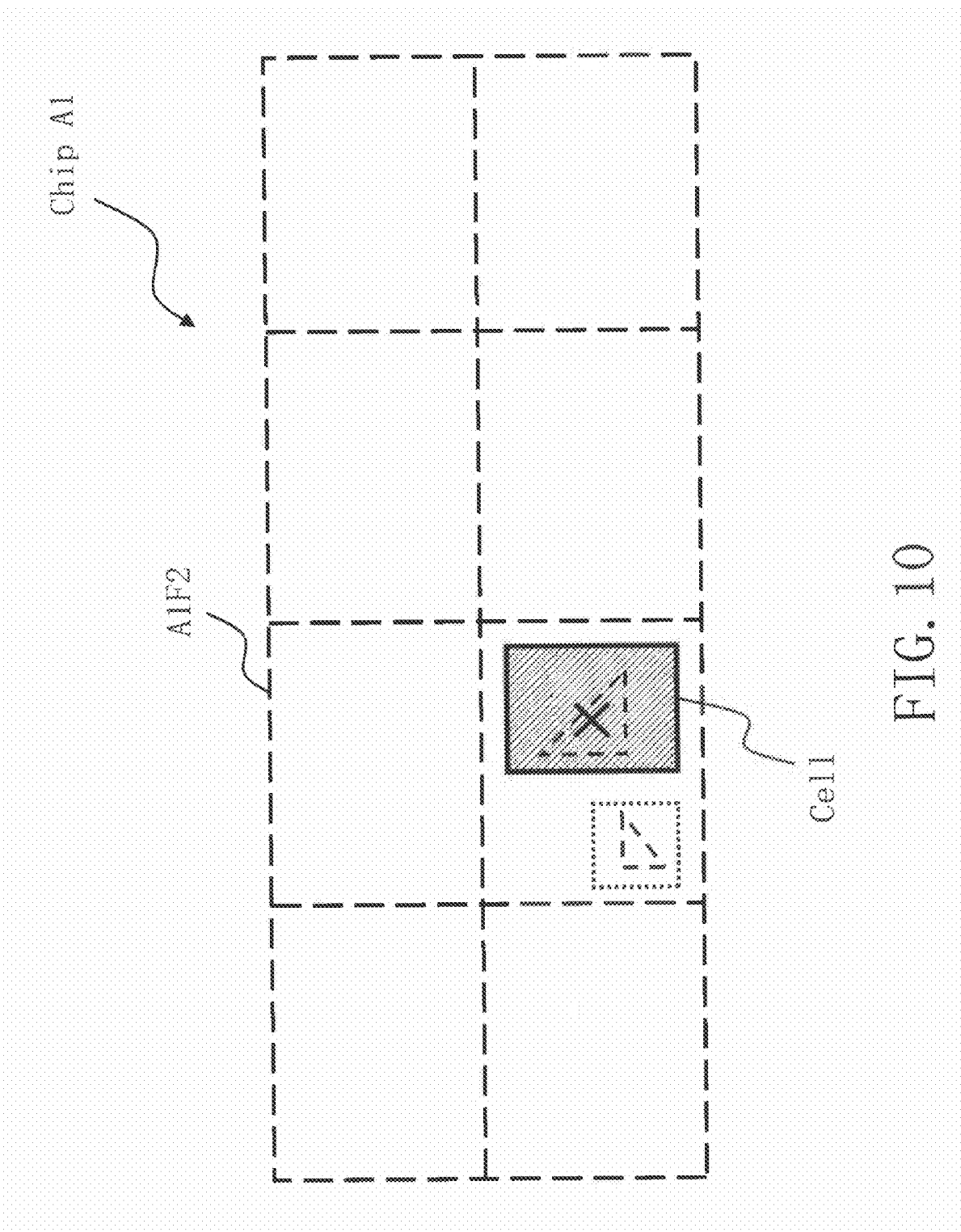
FIG. 10 is a conceptual diagram showing an example in which an extraction unit is a cell specified by the coordinate specification according to Embodiment 1.

FIG. 10 is a conceptual diagram showing an example in which an extraction unit is a cell specified by coordinate specification according to Embodiment 1.

In FIG. 10, a case where the cell containing the specified coordinates is extracted is shown.

Figure 11:
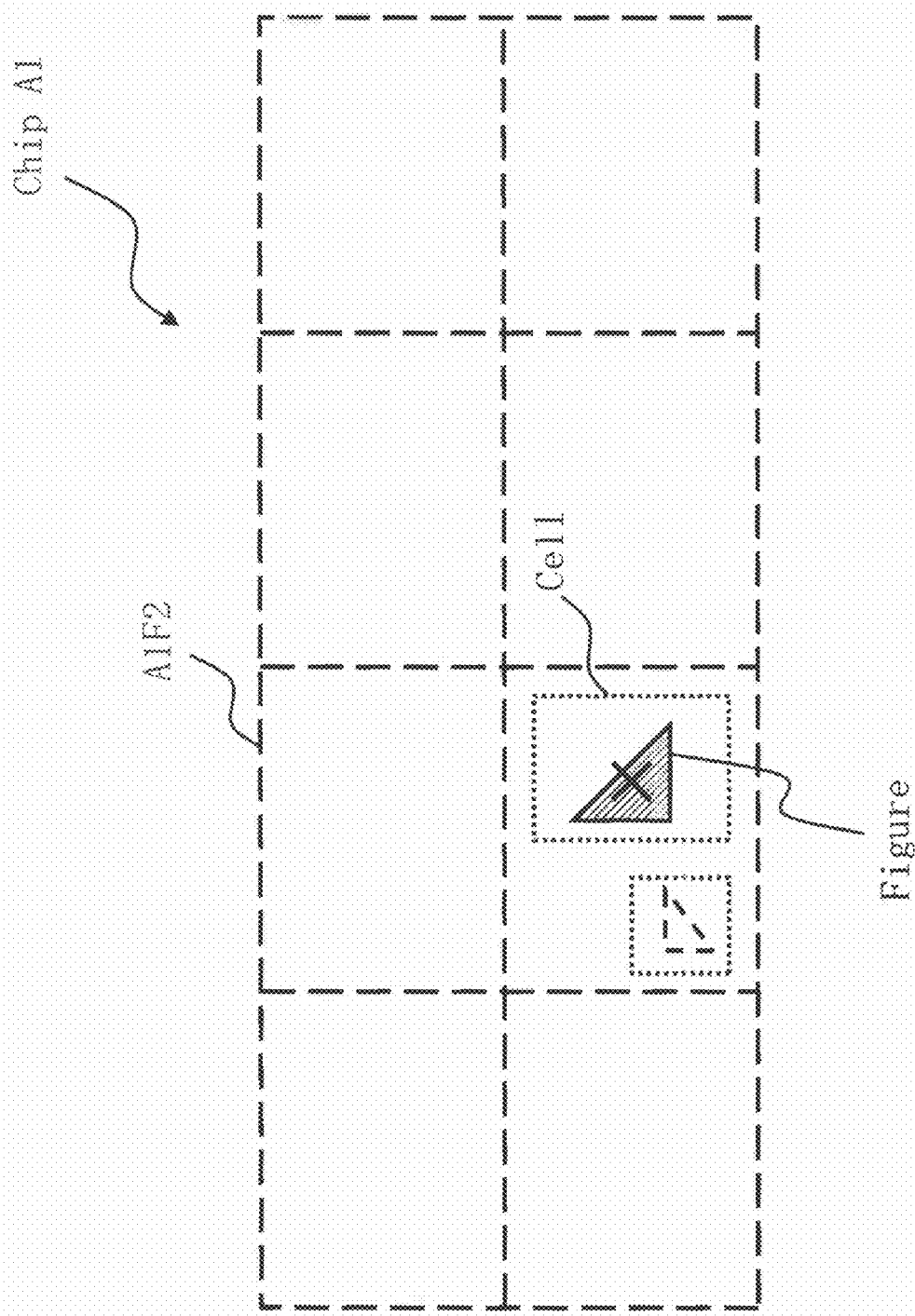
FIG. 11 is a conceptual diagram showing an example in which an extraction unit is a figure specified by the coordinate specification according to Embodiment 1.

FIG. 11 is a conceptual diagram showing an example in which an extraction unit is a figure specified by coordinate specification according to Embodiment 1.

In FIG. 11, a case where the figure containing the specified coordinates is extracted is shown.

FIGS. 8 to 11 shown above are cases that are effective when data of one write frame is not needed for verification of an operation error. Next, a case where data of one write frame is needed will be described.

Figure 12:
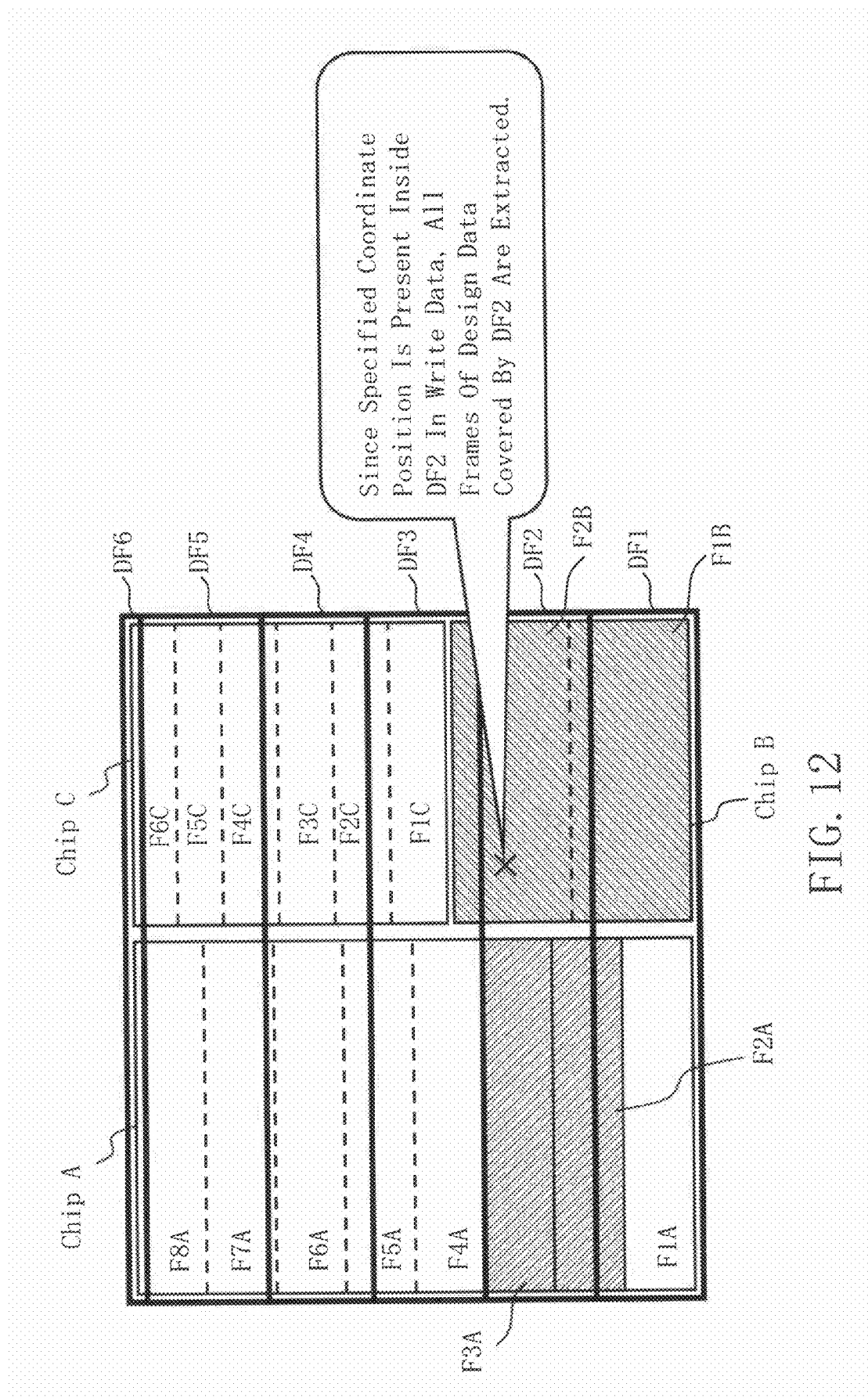
FIG. 12 is a conceptual diagram showing an example in which an extraction unit is all frames contained in a write frame specified by the coordinate specification according to Embodiment 1.

FIG. 12 is a conceptual diagram showing an example in which an extraction unit is all frames contained in a write frame specified by coordinate specification according to Embodiment 1.

In FIG. 12, a case where chip frames before chip-merging are even slightly across (overlap with) the write frame containing the specified coordinates are extracted is shown. Here, an example in which the specified coordinate position is present inside the write frame 2 (DF2) and thus, a frame 2 (F2A) and a frame 3 (F3A) of the chip A and a frame 1 (F1B)

and a frame 2 (F2B) of the chip B in which the regions constituting the write frame 2 are contained are set as the extraction region is shown.

How far from the above specified coordinates, the range should be defined as an extraction region may be set, for example, as a margin value in the parameter information 154.

Figure 13:
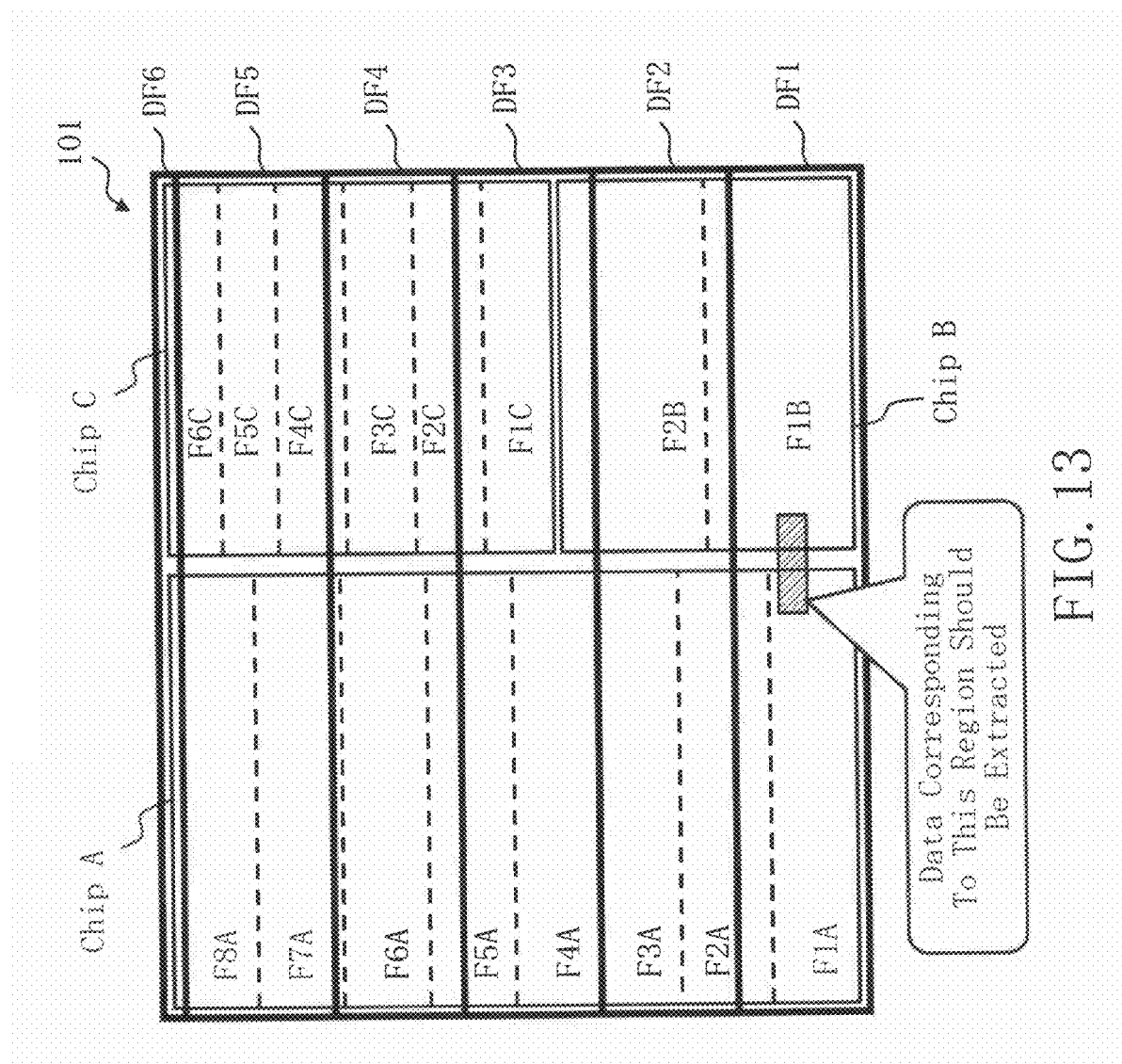
FIG. 13 is a conceptual diagram showing an example of extraction specified by region specification according to Embodiment 1.

Next, a case where region specification is carried out by specifying some region (a region enclosed by a rectangle (or a square) having two coordinate positions as diagonal vertices) containing the portion that causes an error as specification information as shown in FIG. 13 will be described.

Figure 14:
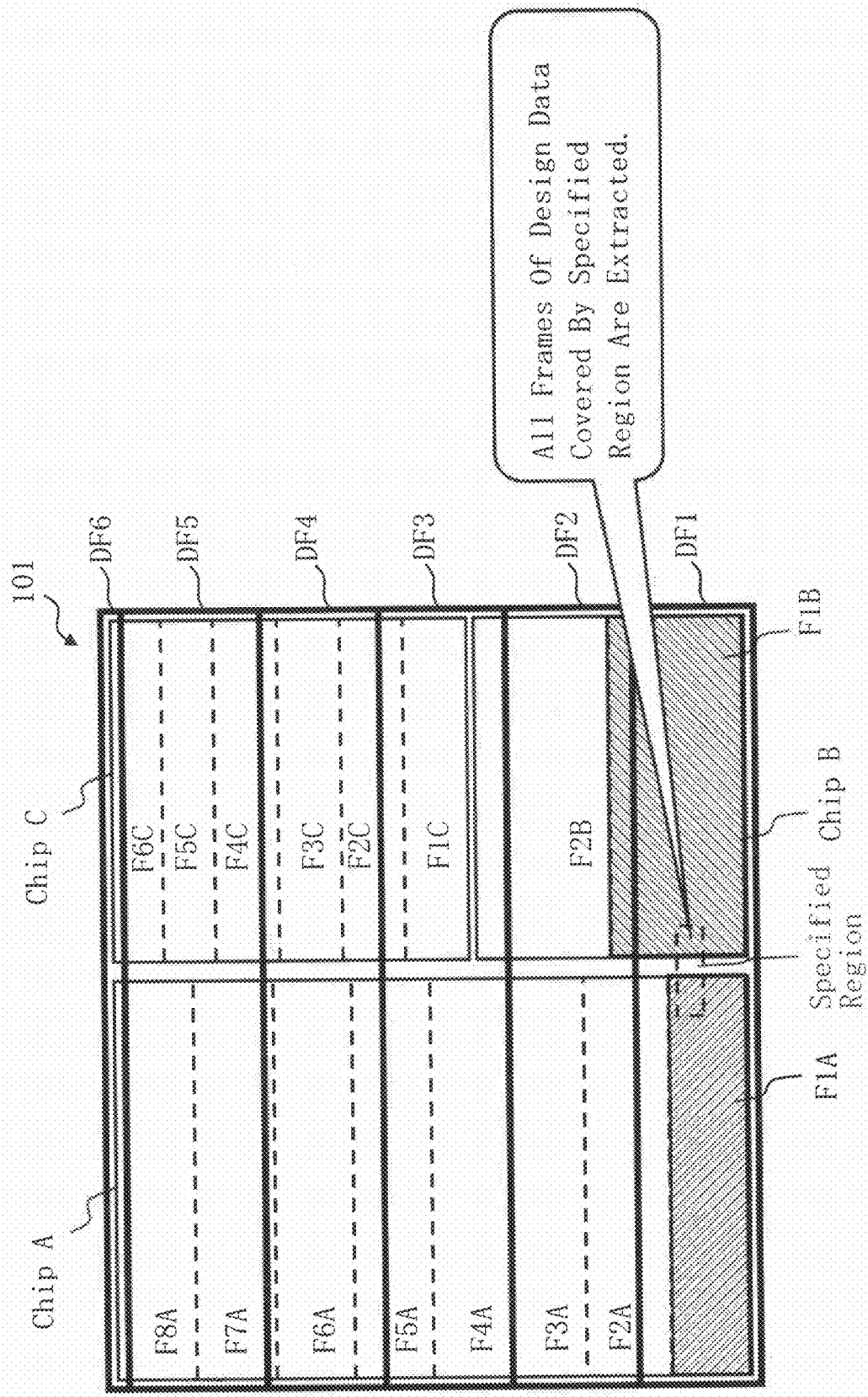
FIG. 14 is a conceptual diagram showing an example in which an extraction unit is an entire frame specified by the region specification according to Embodiment 1.

FIG. 14 is a conceptual diagram showing an example in which extraction unit is entire frames specified by region specification according to Embodiment 1. In FIG. 14, a case where all frames overlapping with the specified frame even slightly are extracted is shown. Here, a case where the specified region overlaps with the frame 1 (F1A) of the chip A and the frame 1 (F1B) of the chip B and thus, the frame 1 (F1A) of the chip A and the frame 1 (F1B) of the chip B are set as the extraction region is shown.

Figure 15:
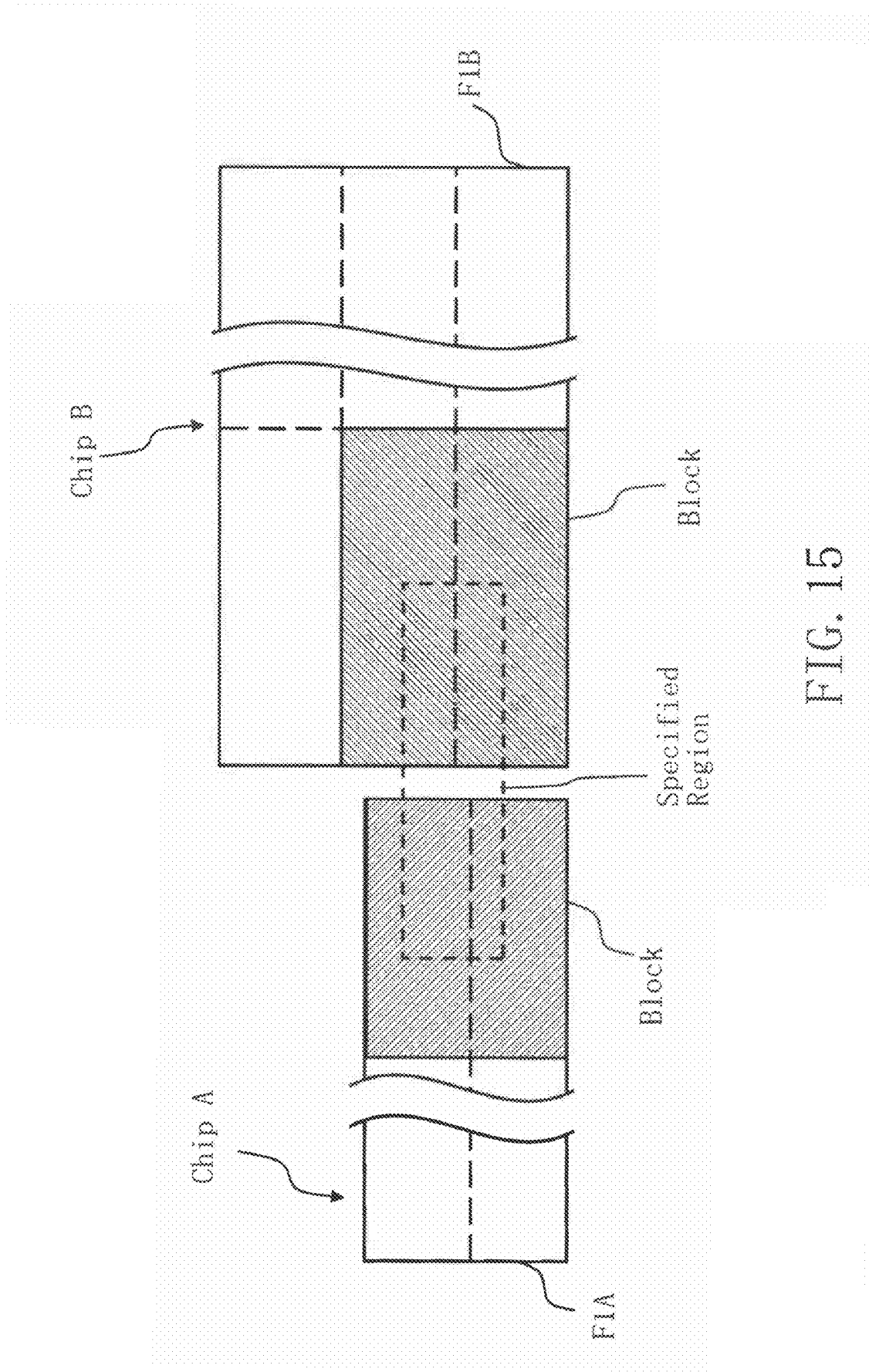
FIG. 15 is a conceptual diagram showing an example in which an extraction unit is a block specified by the region specification according to Embodiment 1.

FIG. 15 is a conceptual diagram showing an example whose extraction unit is the block specified by the region specification according to Embodiment 1. In FIG. 15, a case where blocks that even slightly overlap with the specified region are extracted is shown. Here, a case where the specified region overlaps with a part of blocks of the frame 1 (F1A) of the chip A and a part of blocks of the frame 1 (F1B) of the chip B and thus, the part of blocks of the frame 1 (F1A) of the chip A and the part of blocks of the frame 1 (F1B) of the chip B are set as the extraction region is shown.

Figure 16:
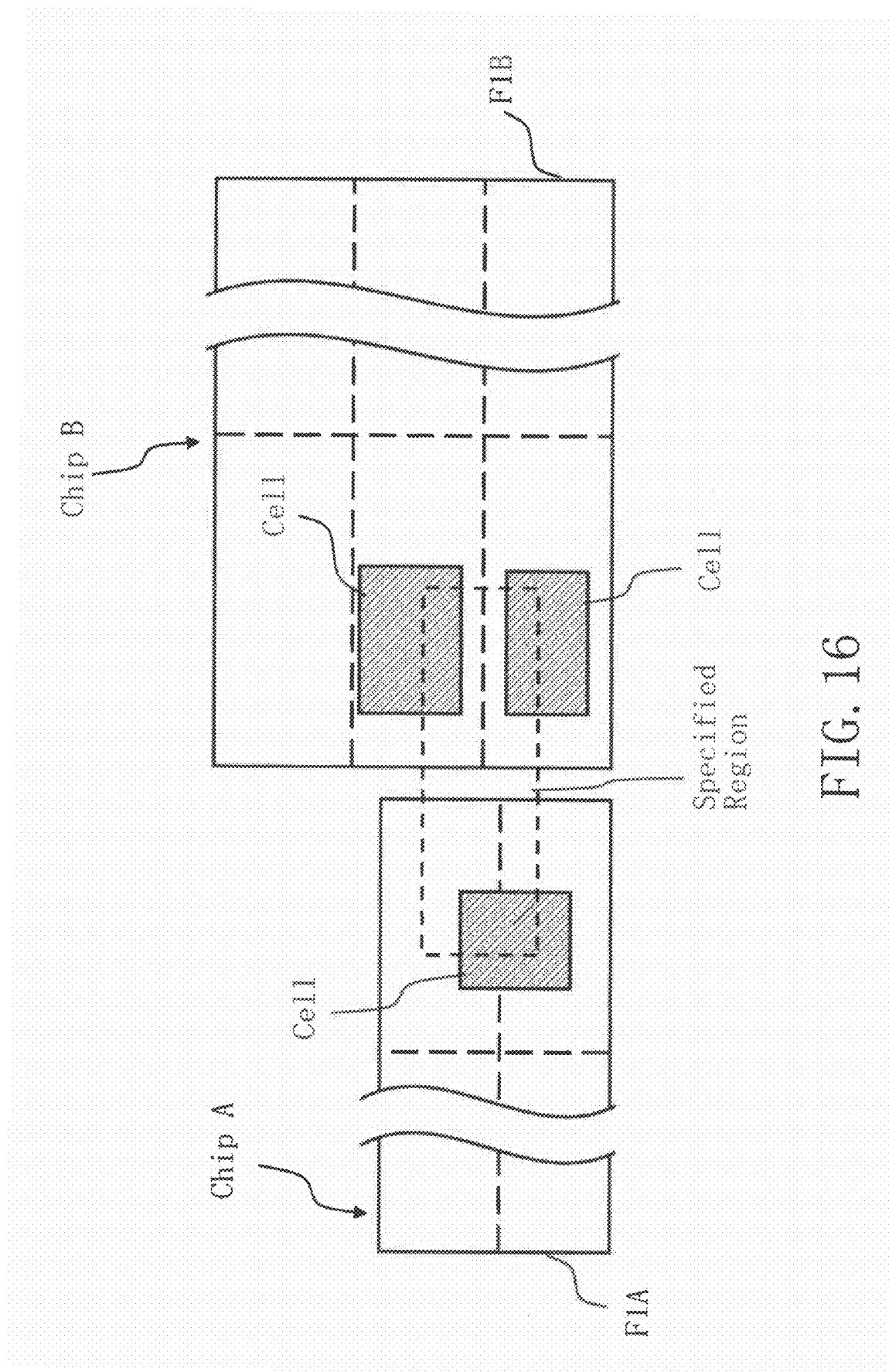
FIG. 16 is a conceptual diagram showing an example in which an extraction unit is a cell specified by the region specification according to Embodiment 1.

FIG. 16 is a conceptual diagram showing an example whose extraction unit is the cell by the region specification according to Embodiment 1. In FIG. 16, a case where cells overlapping even slightly with the specified region are extracted is shown.

Figure 17:
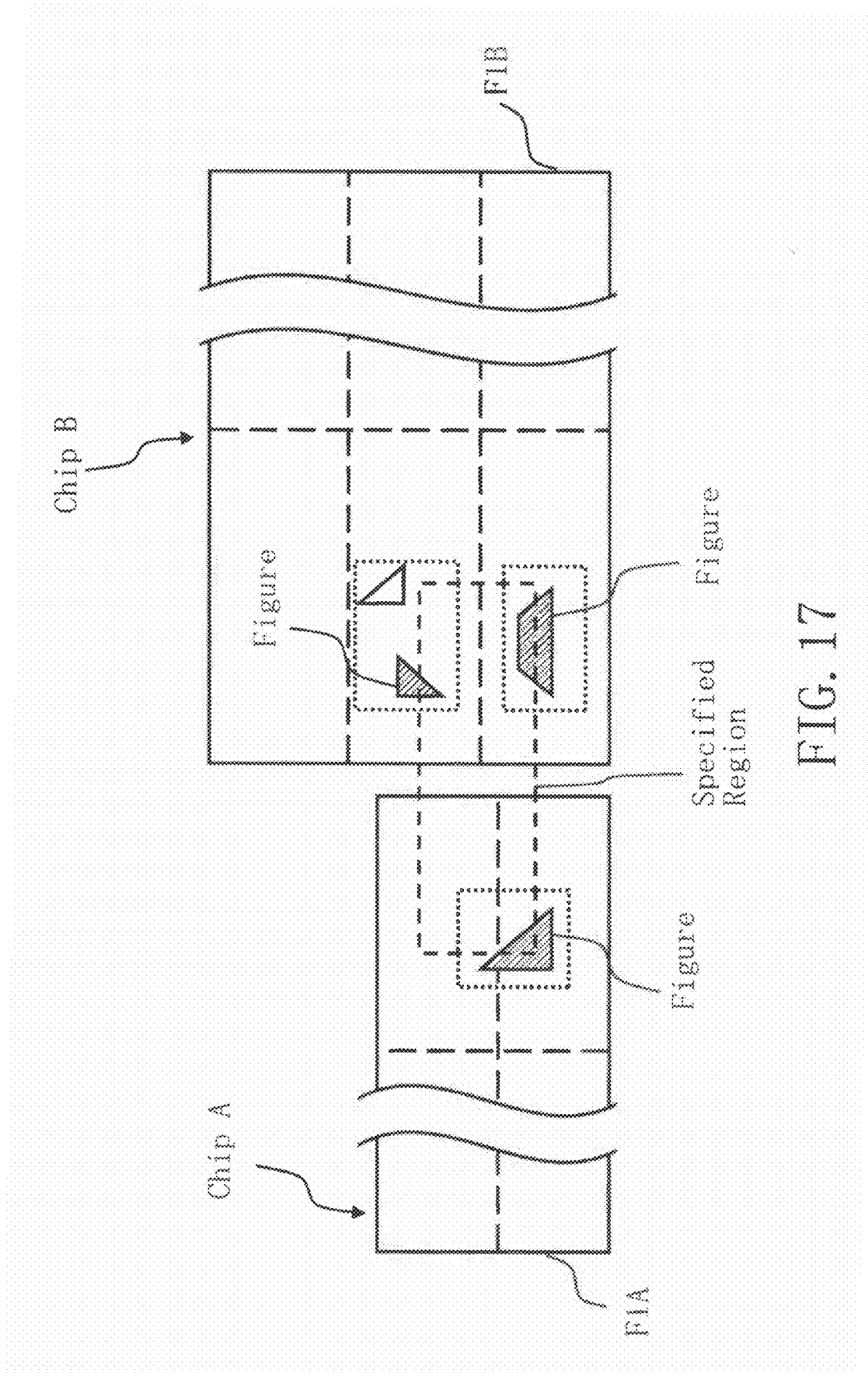
FIG. 17 is a conceptual diagram showing an example in which an extraction unit is a figure specified by the region specification according to Embodiment 1.

FIG. 17 is a conceptual diagram showing an example whose extraction unit is the figure by the region specification according to Embodiment 1. In FIG. 17, a case where figures overlapping even slightly with the specified region are extracted is shown.

FIGS. 15 to 17 as described above are cases that are effective when data of one write frame is not needed for verification of an operation error. Next, a case where data of one write frame is needed will be described.

Figure 18:
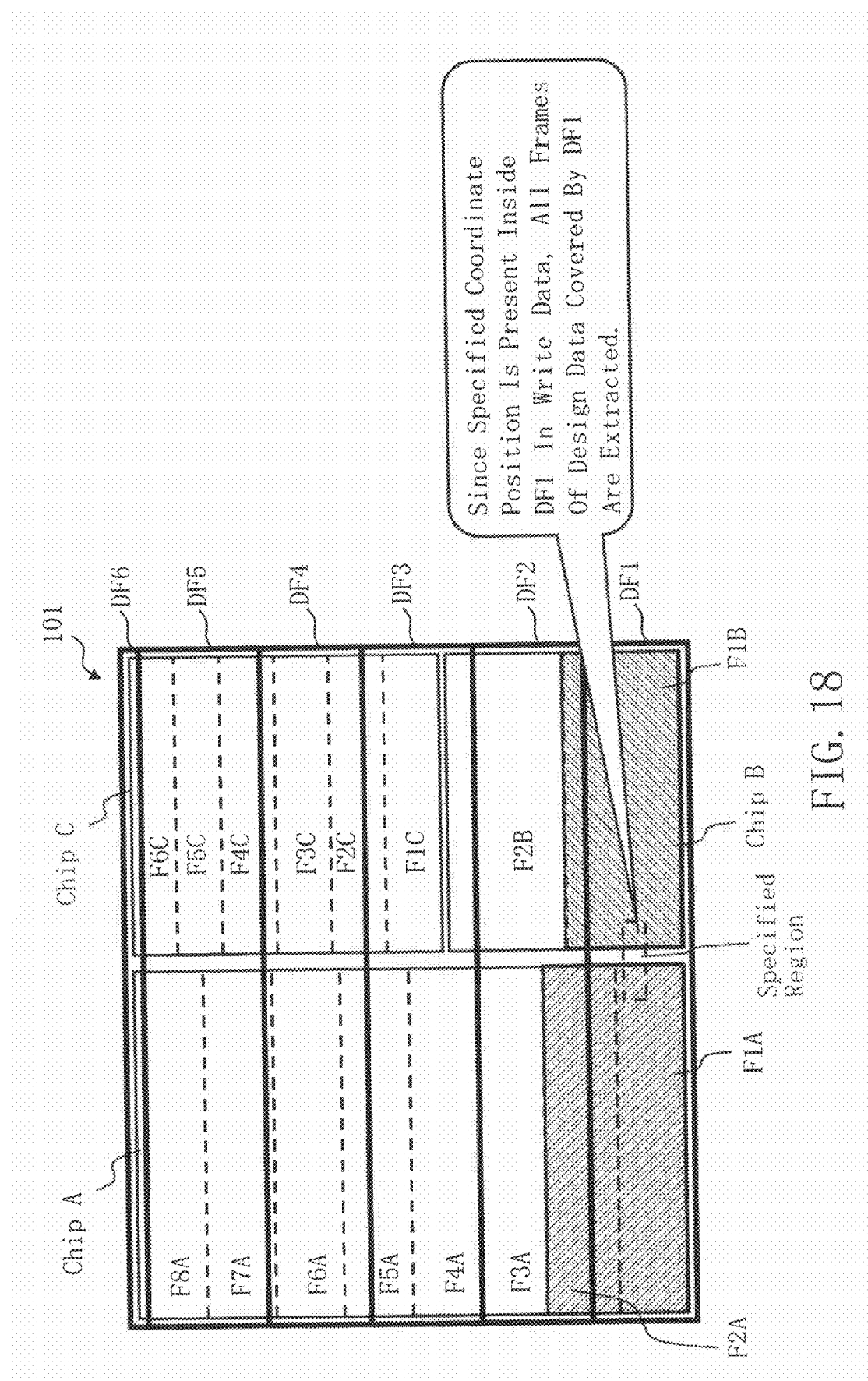
FIG. 18 is a conceptual diagram showing an example in which an extraction unit is all frames contained in the write frame specified by the region specification according to Embodiment 1.

FIG. 18 is a conceptual diagram showing an example whose extraction unit is all frames contained in the write frame specified by the region specification according to Embodiment 1. In FIG. 18, a case where chip frames before chip-merging that are even slightly across (overlap with) the write frame containing the specified region are extracted is shown. Here, an example in which the specified region is present inside the write frame 1 (DF1) and thus, the frame 1 (F1A) and the frame 2 (F2A) of the chip A and the frame 1 (F1B) of the chip B in which a region constituting the write frame 1 is contained are set as the extraction region is shown.

How far from the above region coordinates, the range should be defined as an extraction region may be set, for example, as described above, as a margin value in the parameter information 154. When, for example, a pattern error after formation of a pattern is verified, the region specification can be carried out at a location that can be checked by visual inspection and thus is superior inconvenience. Moreover, when errors occurred at a plurality of portions, the region specification can be carried out collectively, which makes the region specification suitable.

Next, a case where hierarchical number specification in which a specific hierarchical number (an example of the identifier) or name (an example of the identifier) of some internal configuration containing the portion that has caused an error is specified as specification information is carried out will be described. For example, the identifier such as the write frame number, block number, cell number, and figure number in write data can be used. The layout data 152 is hierarchized, as described above, into each of a plurality of internal constitutional units such as the chip hierarchy, frame hierarchy, block hierarchy, cell hierarchy, and figure hierarchy and write data after chip merging and write data conversion is also hierarchized into each of a plurality of internal constitutional units such as the chip hierarchy, frame hierarchy, block hierarchy, cell hierarchy, and figure hierarchy. Then, each internal constitutional unit is provided with a new number or name other than those of each internal constitutional unit in the layout data. Here, necessary data in the layout data 152 is specified by using the specific hierarchical number or the like of the internal constitutional unit in the write data.

Figure 19:
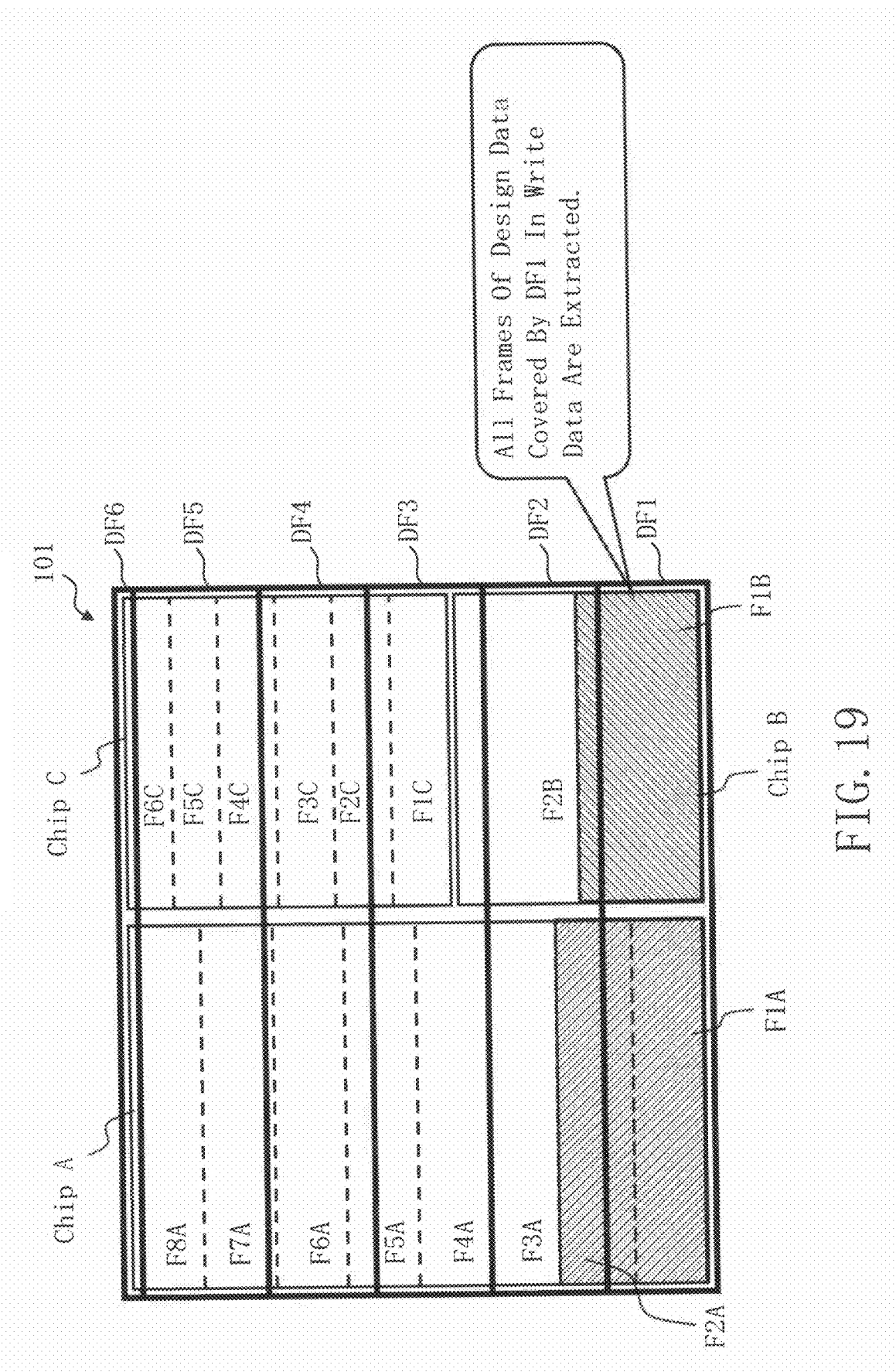
FIG. 19 is a conceptual diagram showing an example in which an extraction unit is all frames overlapping with the write frame specified by hierarchical number specification according to Embodiment 1.

FIG. 19 is a conceptual diagram showing an example in which an extraction unit is all frames overlapping with the write frame specified by hierarchical number specification according to Embodiment 1. In FIG. 19, a case where chip frames before chip-merging that are even slightly across (overlap with) the write frame specified by the hierarchical number specification are extracted is shown. Here, an example in which the specified hierarchical number indicates the write frame 1 (DF1) and thus, the frame 1 (F1A) and the frame 2 (F2A) of the chip A and the frame 1 (F1B) of the chip B that even slightly are (overlap with) the write frame 1 are set as the extraction region is shown.

Figure 20:
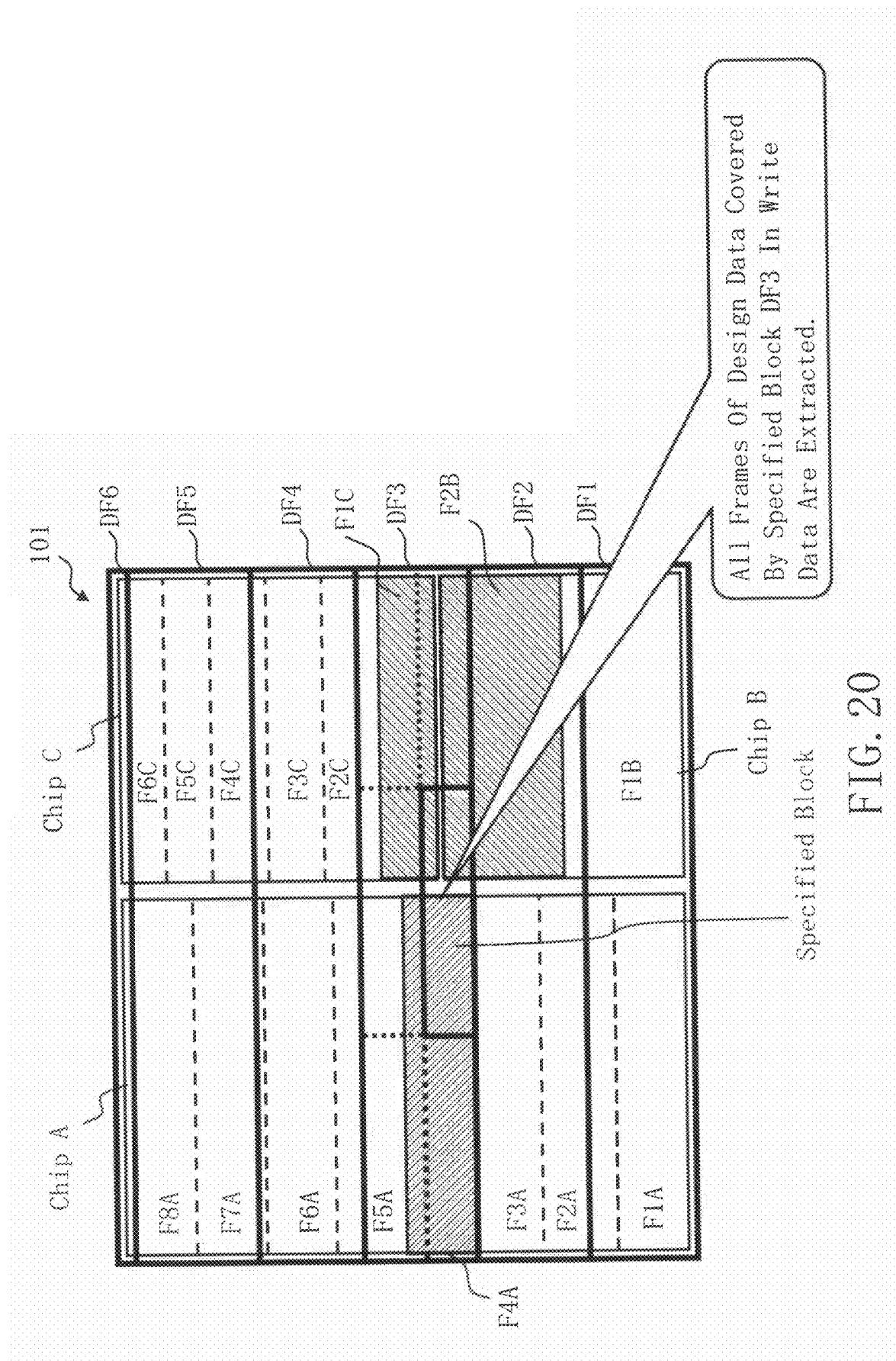
FIG. 20 is a conceptual diagram showing an example in which an extraction unit is all frames overlapping with a block specified by the hierarchical number specification according to Embodiment 1.

FIG. 20 is a conceptual diagram showing an example whose extraction unit is all frames overlapping with the block specified by the hierarchical number specification according to Embodiment 1. In FIG. 20, a case where chip frames before chip-merging that are even slightly across (overlap with) the block specified by the hierarchical number specification in write data are extracted is shown. Here, an example in which the specified hierarchical number indicates a specified block inside the write frame 3 (DF3) and thus, a frame 4 (F4A) of the chip A, the frame 2 (F2B) of the chip B, and a frame 1 (F1C) of the chip C that are even slightly across (overlap with) the specified block are set as the extraction region is shown.

Figure 21:
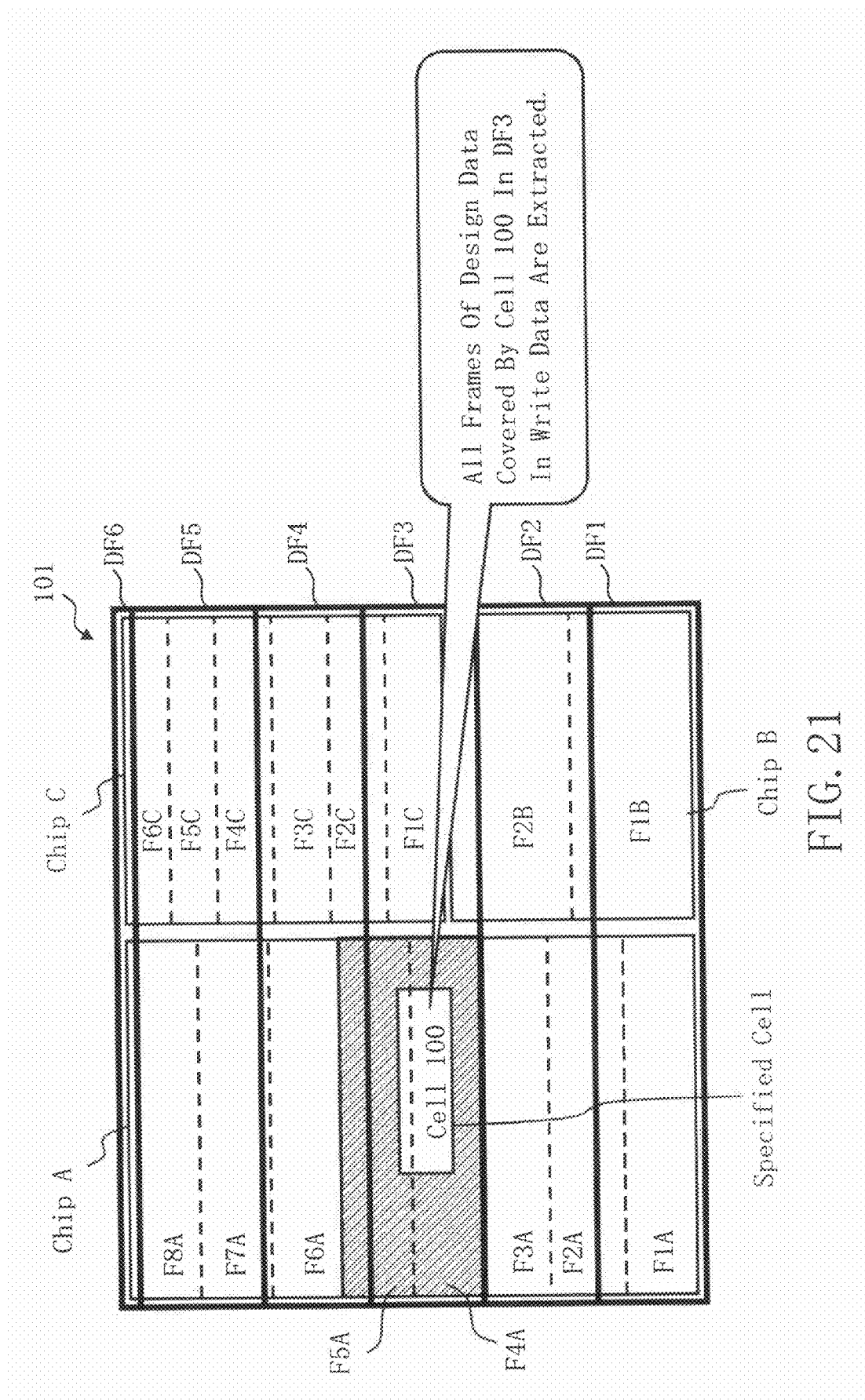
FIG. 21 is a conceptual diagram showing an example in which an extraction unit is all frames overlapping with a cell specified by the hierarchical number specification according to Embodiment 1.

FIG. 21 is a conceptual diagram showing an example in which an extraction unit is all frames overlapping with the cell specified by the hierarchical number specification according to Embodiment 1. In FIG. 21, a case where chip frames before chip-merging that are even slightly across (overlap with) the cell specified by the hierarchical number specification in write data are extracted is shown. Here, an example in which the specified hierarchical number indicates a specified cell (cell 100) in the write frame 3 (DF3) and thus, the frame 4 (F4A) and a frame 5 (F5A) of the chip A that are even slightly across (overlap with) the specified cell are set as the extraction region is shown.

In FIGS. 19 to 21, cases where extraction from the layout data 152 is performed in units of frame are shown, but as described above, extractions may be performed in internal constitutional units of the block hierarchy, cell hierarchy, or figure hierarchy. How far from the above hierarchical number specification, the range should be defined as an extraction region may be set, for example, as described above, as a margin value in the parameter information 154.

In any of cases of FIGS. 8 to 21 described above, if the same chip is arranged at a plurality of portions, internal constitutional units corresponding to the internal constitutional unit to be extracted are present at portions different from the portion where the operation for error verification is needed.

Thus, the data expansion step (S108) is similarly executed to extract data of internal constitutional units to be extracted at all portions. Thus, data of unnecessary portions may be deleted to set the data as null data in the data construction step (S116) before creating evaluation data in which data is defined only for necessary portions.

Embodiment 2

In Embodiment 1, as shown in FIG. 7C, the evaluation data 158 covering the entire write region 10 is created, but the evaluation data 158 is not limited to this. According to Embodiment 2, the configuration to create evaluation data in which a part of the write region 10 is deleted will be described.

Figure 22:
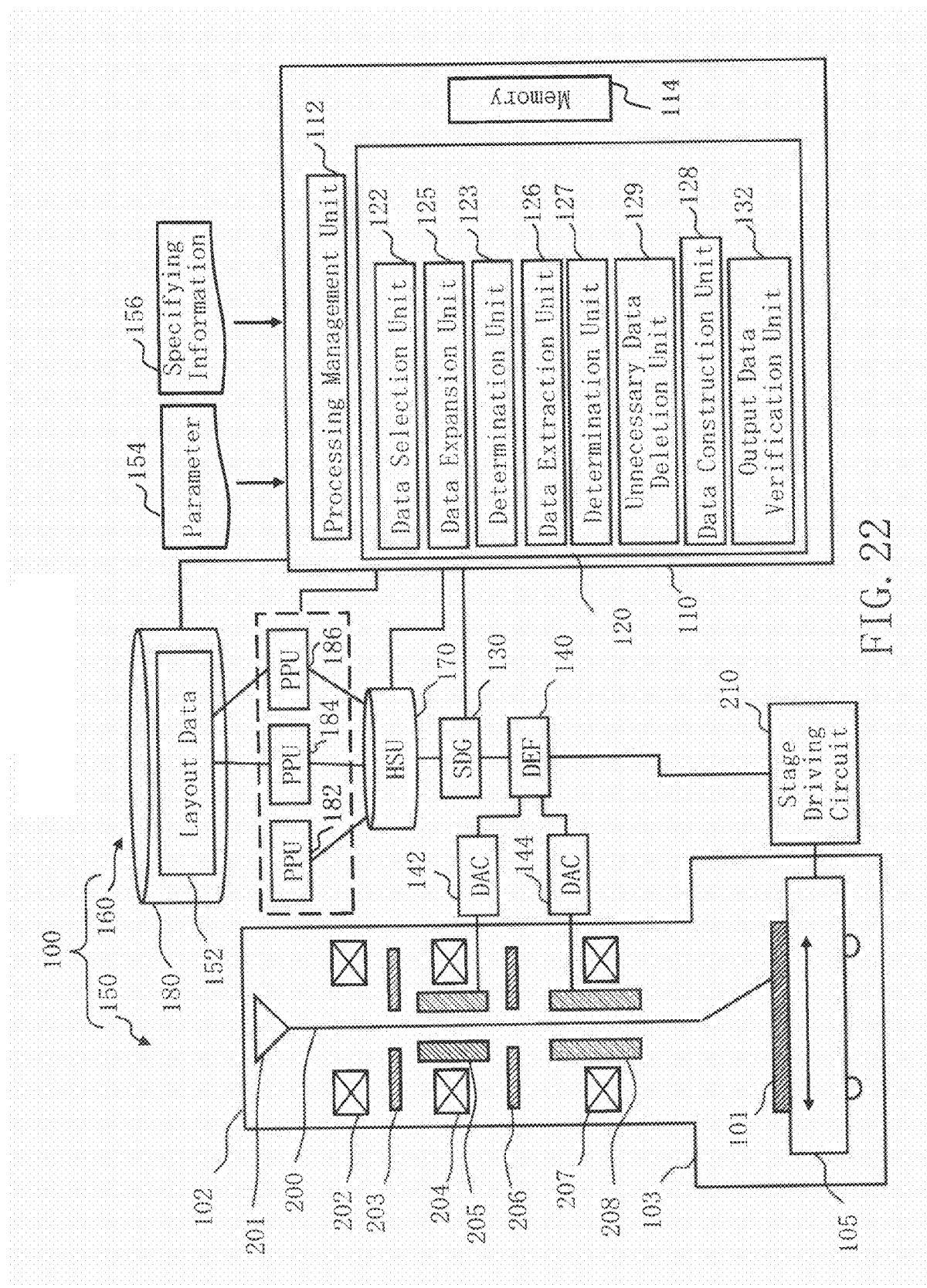
FIG. 22 is a conceptual diagram showing the configuration of the writing apparatus according to Embodiment 2.

FIG. 22 is a conceptual diagram showing the configuration of the writing apparatus according to Embodiment 2. FIG. 22 is the same as FIG. 1 except that a determination unit 127 and an unnecessary data deletion unit 129 are added to the evaluation data creation unit 120.

Figure 23:
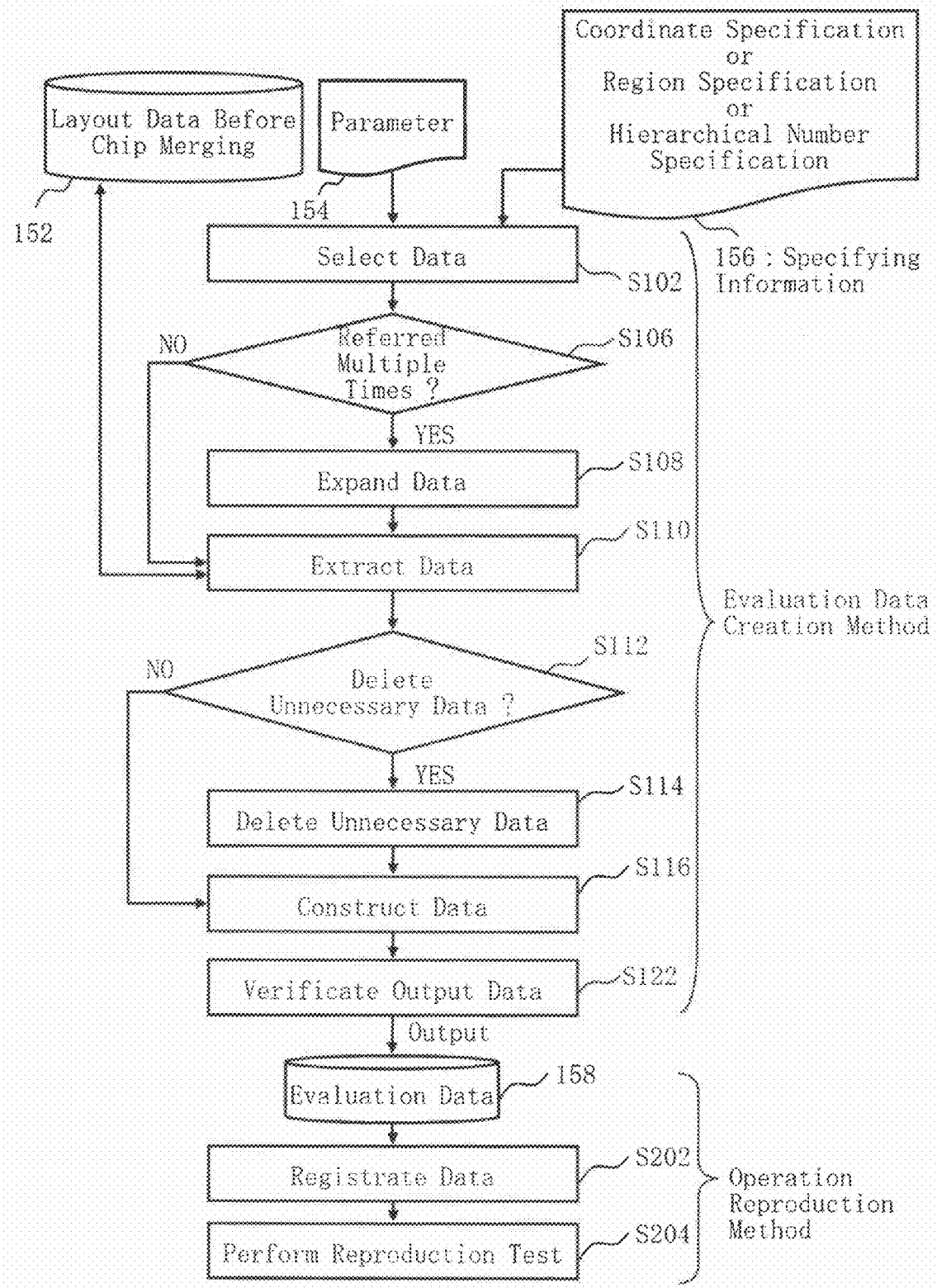
FIG. 23 is a flow chart showing main steps of the evaluation data creation method and the operation reproduction method in the second embodiment according to Embodiment 2.

FIG. 23 is a flow chart showing main steps of the evaluation data creation method and the operation reproduction method according to Embodiment 2. FIG. 23 is the same as FIG. 6 except that a determination step (S112) and an unnecessary data deletion step (S114) are added to between the data extraction step (S110) and the data construction step (S116).

Content different from that in Embodiment 1 will be described below. Thus, content not described below is the same as that in Embodiment 1.

Figure 24:
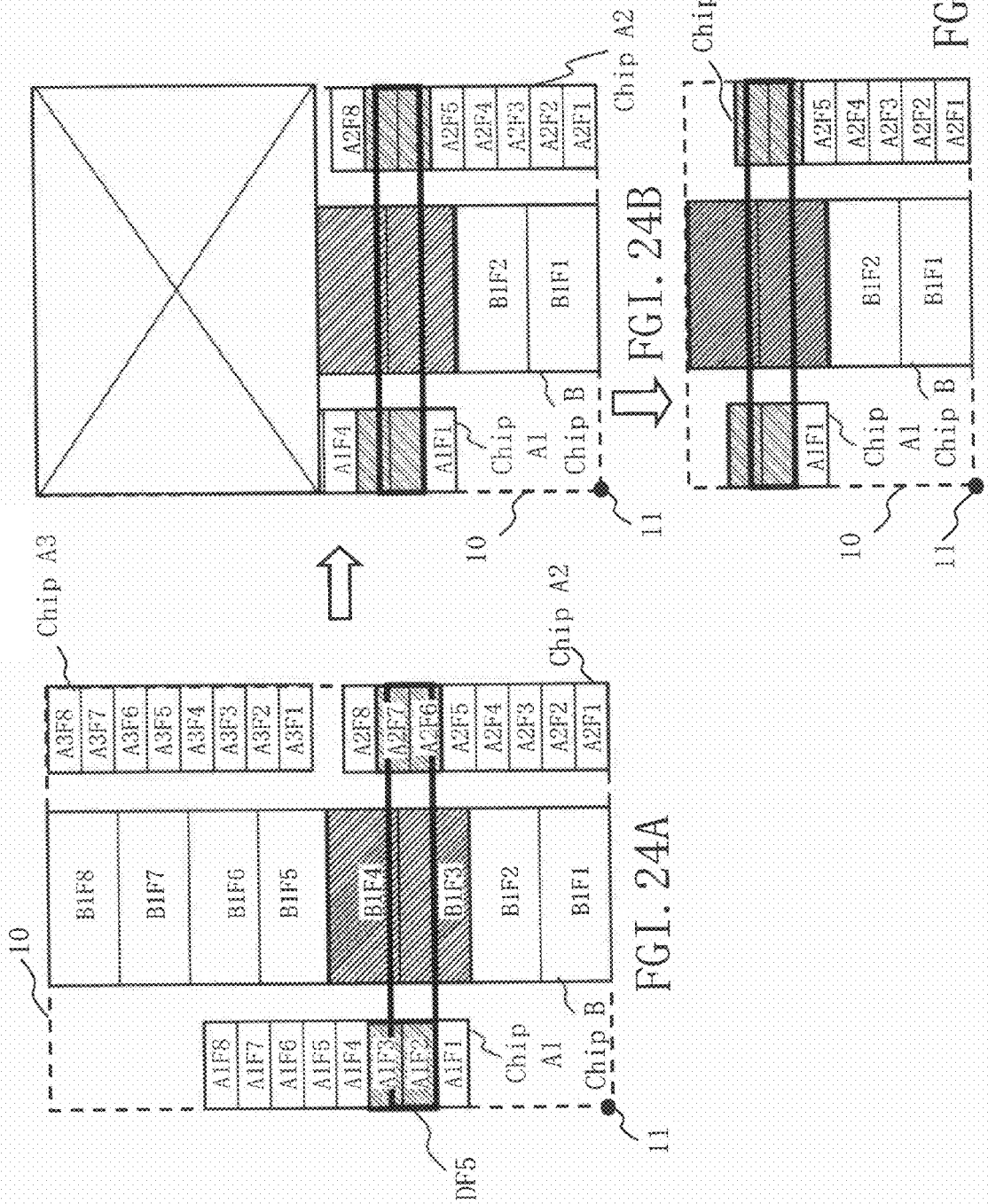
FIGS. 24A to 24C are diagrams exemplifying a layout configuration in the Embodiment 2.

FIGS. 24A to 24C are diagrams showing an example of the layout configuration according to Embodiment 2. FIG. 24A shows the same content as that shown in FIG. 7C. Even if the evaluation data 158 other than the frame across DF5 is null data as shown in FIG. 24A, it is sufficient to form a pattern up to DF5 for verification and thus, data of portions (region) on which a pattern is formed thereafter is originally unnecessary. Therefore, according to Embodiment 2, the following process is performed after the data extraction step (S110).

In S112, as the determination step, the determination unit 127 determines whether it is required to delete unnecessary data. The write operation is started from a base point 11 at the lower left corner of the write region 10. Then, the write operation proceeds sequentially on DF1, DF2, . . . . Thus, in view of layout, as shown in FIG. 24A, it is sufficient to be able to form a pattern up to DF5 where an error should be verified. For this purpose, as shown in FIG. 24B, pieces of data in frames following the frame of A1F3 in the chip A1, frames following the frame of B1F4 in the chip B, the frame of A2F8 in the chip A2, and all frames in the chip A3 are unnecessary. Here, the determination unit 127 determines that it is not required to delete unnecessary data and thus the process proceeds to S114. If the write frame where an error should be verified needs frames at the rearmost part of the write region 10, the determination unit 127 may determine that it is not required to delete unnecessary data and thus the process may proceed to S116.

In S114, as the unnecessary data deletion step (S114), the unnecessary data deletion unit 129 deletes, as shown in FIG. 24C, pieces of data in frames of A1F4 and thereafter in the chip A1, frames of B1F5 and thereafter in the chip B, the frame of A2F8 in the chip A2, and all frames in the chip A3 as unnecessary regions (second region) of the target object containing portions to be written after DF5 where a write error has occurred. To put another way, the unnecessary data deletion unit 129 deletes data of frames after the frame across DF5 necessary for verification of a write error.

Then, in the data construction step (S116), the data construction unit 128 constructs evaluation data in such a way that regions where frames after the frame across DF5 are arranged are deleted. At this time, heights of remaining frames do not match and thus, the region may be cut off by aligning with the end of the frame protruding on the rearmost side. In the example in FIG. 24C, the frame of B1F4 mostly protrudes to the rear side and thus, the region may be cut off at the end of the frame of B1F4. Regions (first region) of the target object containing frames of portions written prior to DF5 of extracted frames may be created, as described above, as null data where no pattern information is defined. Here, frames of A2F2 and A2F3 of the chip A2 apply. The frame of A1F1 in the chip A1, frames of B1F1 and B1F2 in the chip B, and frames of A2F1 to A2F5 in the chip A2 containing such frames are created as null data.

As described above, verification data is created in such a manner that out of a plurality of portions, data for the first region of the target object which contains portions to be written prior to the portion that has caused a write error is created with no pattern information is defined, data for the second region of the target object containing portions to be written after the portion that has caused the write error is deleted.

By using evaluation data in which regions to be written after the portion necessary for the reproduction test are deleted, the time that would be necessary for processing of the deleted latter null region can be reduced and as a result, the reproduction test time can further be reduced. Moreover, due to a reduced time that would be necessary for processing of the deleted latter null region, the number of files of chip data and the amount of data are reduced. Thus, the data preparation processing time before a pattern is formed can be reduced.

Embodiment 3

In Embodiment 3, a case where, in addition to content of the Embodiment 2, a layout configuration file for evaluation data is created will be described.

Figure 25:
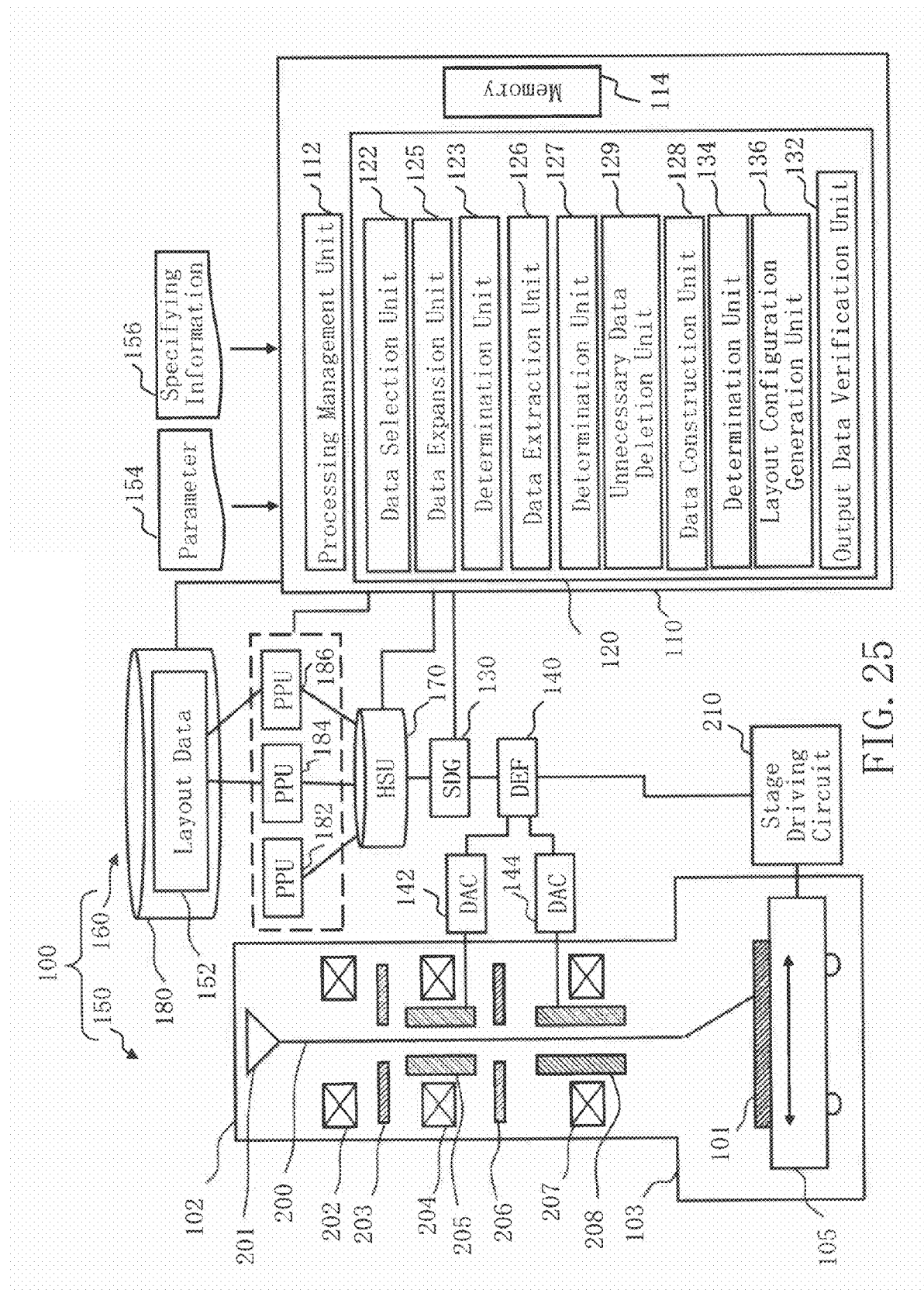
FIG. 25 is a conceptual diagram showing the configuration of the writing apparatus in Embodiment 3.

FIG. 25 is a conceptual diagram showing the configuration of the writing apparatus in Embodiment 3. FIG. 25 is the same as FIG. 22 except that a determination unit 134 and a layout configuration generating unit 136 are added to the evaluation data creation unit 120.

Figure 26:
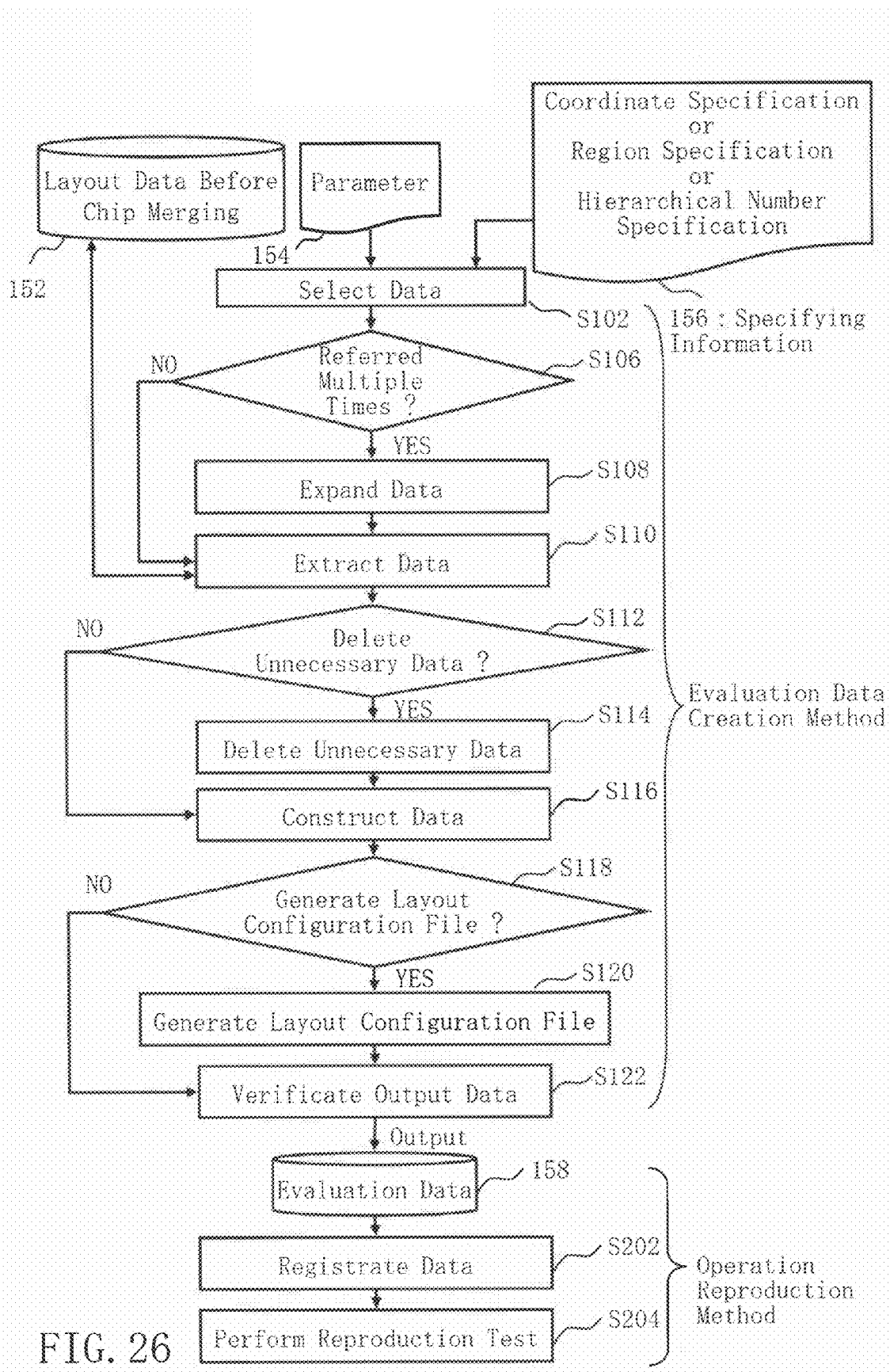
FIG. 26 is a flow chart showing main steps of the evaluation data creation method and the operation reproduction method in Embodiment 3.

FIG. 26 is a flow chart showing main steps of the evaluation data creation method and the operation reproduction method in Embodiment 3. FIG. 26 is the same as FIG. 23 except that a determination step (S118) and a layout configuration file generation step (S120) are added to between the data construction step (S116) and the output data verification step (S122).

Content different from that in Embodiment 2 will be described below. Thus, content not described below is the same as that in Embodiment 2.

Figure 27A:
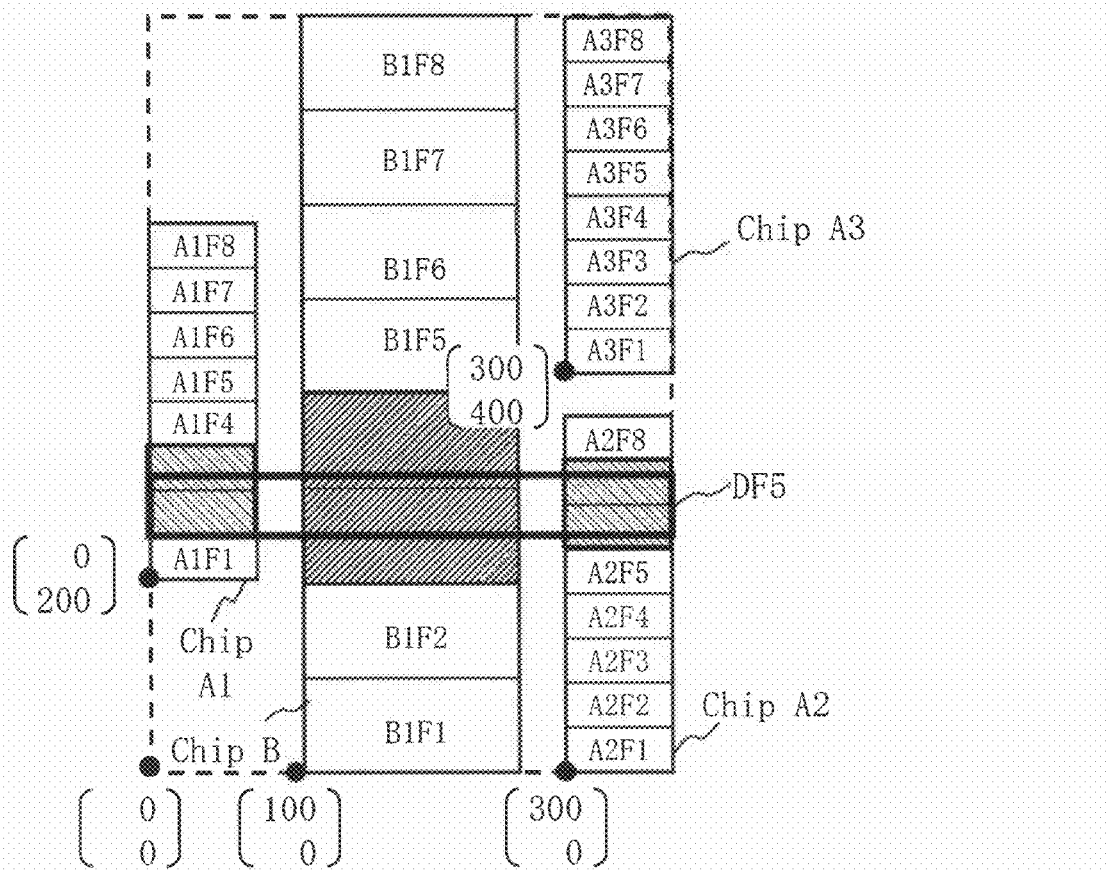
FIGS. 27A and 27B are diagrams exemplifying the layout configuration in Embodiment 3.
Figure 27B:
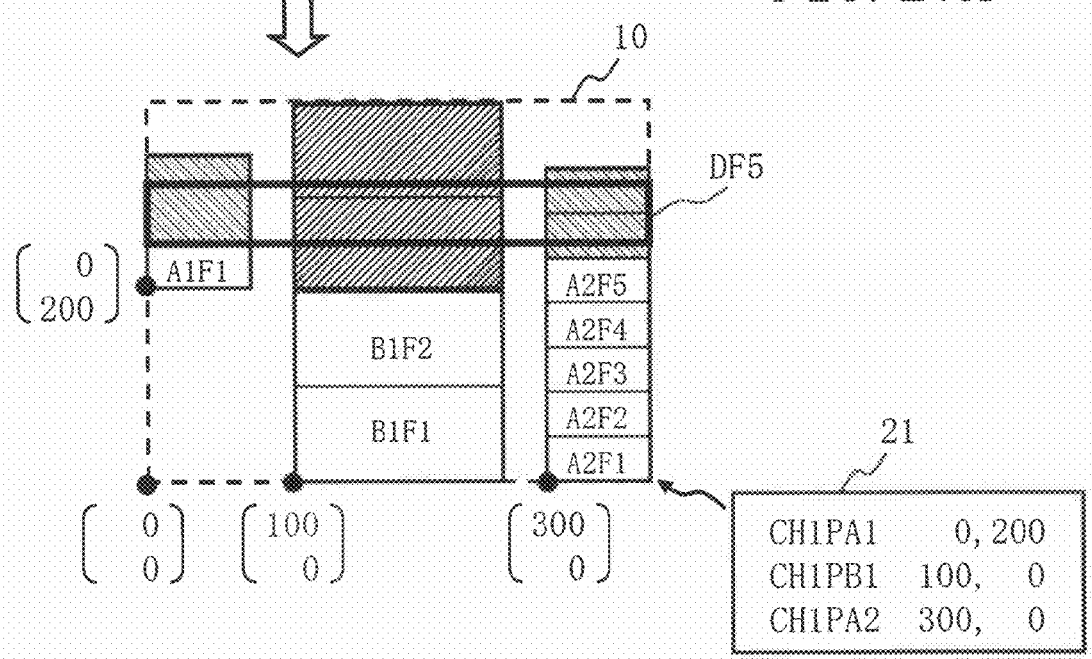
Figure 28:
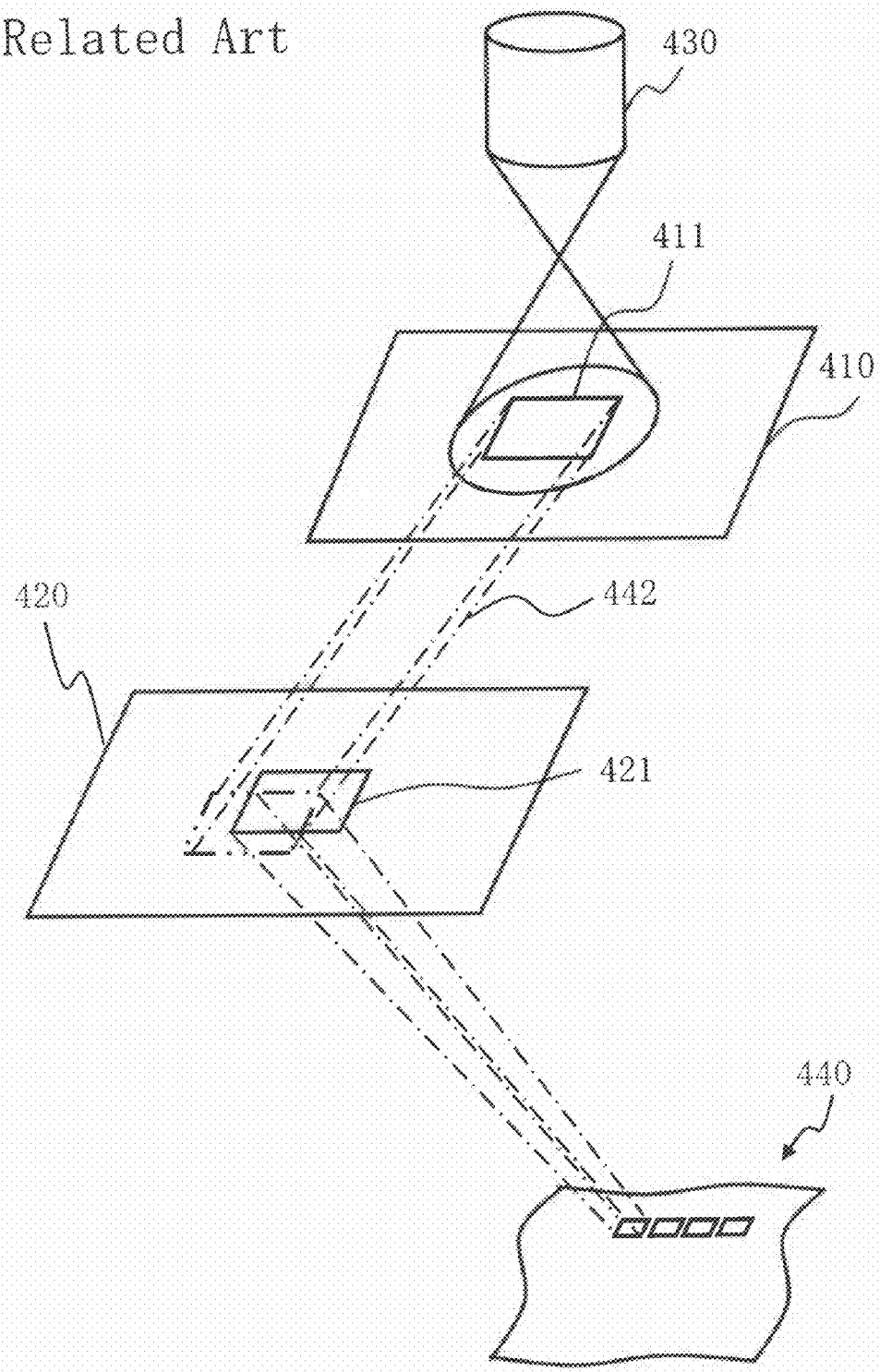
FIG. 28 is a conceptual diagram for explaining the operation of a variable-shaped electron beam writing apparatus.

FIGS. 27A and 27B are diagrams showing an example of the layout configuration in Embodiment 3. FIG. 27A shows the same content as that shown in FIG. 7C. FIG. 27A shows arrangement position information of each chip. In FIG. 27A, the reference position of each chip is shown as a distance from the coordinates (0, 0) of the base point. While evaluation data in which, as shown in FIG. 27B, regions to be written after DF5 necessary for the reproduction test are deleted is created by the data construction step (S116), a layout configuration file for the evaluation data is created in Embodiment 3.

In S118, as the determination step, the determination unit determines whether to generate a layout configuration file. Whether to generate a layout configuration file may be preset.

Then, if a layout configuration file should be generated, the process may proceed to S120. If a layout configuration file should not be generated, the process may proceed to S122.

In S120, as the layout configuration file generation step, the layout configuration generating unit 136 creates a layout configuration file 21 for evaluation data created by the data construction step (S116). The layout configuration file 21 for evaluation data defines, as shown in FIG. 27B, arrangement coordinates of the chips A1 and A2 and the chip B to be arranged. While it is desirable to create a layout configuration file for reproduction test data when a reproduction test is performed, since the evaluation data creation unit 120 creates the layout configuration file 21 for evaluation data, an operation error that would be caused when created separately can be prevented. Moreover, the creation time for separate creation can be reduced.

According to at least one of the above embodiments, data of portions other than the portion that has caused an error out of a plurality of portions where the same pattern is arranged can be excluded from verification data. Thus, verification of unnecessary data can be avoided so that the time of error examination can be reduced.

In the above description, processing or operation of what is described as a " . . . unit" or " . . . step" may be realized by a program that can be run on a computer. Or, besides a program as software, the processing or operation may be executed by a combination of hardware and software. Or, firmware may be used in combination. When configured by a program, the program is recorded in a recording medium such as a magnetic disk drive, magnetic tape device, FD, and ROM (read-only memory).

If the evaluation data creation unit 120 or the writing control unit 110 is realized by a control computer constituting a computer in FIGS. 1, 22, and 25, the evaluation data creation unit 120 or the writing control unit 110 may further be connected to a RAM (random access memory), ROM, or magnetic disk (HD) drive serving as examples of the storage apparatus, a keyboard (K/B) or mouse serving as examples of the input unit, a monitor or printer serving as examples of the output unit, or an external interface (I/F), FD, DVD, or CD serving as examples of the input/output unit via a bus (not shown).

The embodiments have been explained with reference to concrete examples. However, the present invention is not limited to the concrete examples. For example, in addition to the above electron beam writing apparatus, the present invention can also be applied to a laser writing apparatus that forms a pattern on a target object by using a laser.

Although parts such as an apparatus configuration and control method which are not directly required for the explanation of the present invention are not described, a required apparatus configuration or a required control method can be arbitrarily selected and used. For example, although a configuration of a control unit which controls the writing apparatus 100 is not described, a required control unit configuration can be arbitrarily selected and used as a matter of course.

In addition, all writing apparatuses, write error verification methods of the writing apparatuses, and creation apparatuses of write error verification data of the writing apparatus having elements of the present invention and obtained by those skilled in the art through appropriate change of the design are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A write error verification method of a writing apparatus verifying a write error after a write operation being started in the writing apparatus to which layout data containing a figure pattern to be formed is input and which forms the figure pattern on a target object based on the layout data input, the write error verification method comprising:
   when a write error occurs in a process between input of the layout data into the writing apparatus and inspection of the target object on which the figure pattern is formed, selecting, with a computer or a hardware, a part of the layout data necessary for operation of a function that has caused the write error;
   extracting, with the computer or a hardware, parts of the layout data corresponding to a selected part of the layout data for all of a plurality of portions of the target object when a pattern indicated by the selected part of the layout data is arranged at the plurality of portions of the target object;
   creating, with the computer or a hardware, verification data by deleting at least one part extracted for at least one portion other than a portion that has caused the write error from extracted parts of the layout data and by using remaining data; and
   reproducing, with the computer or a hardware, the operation of the function that has caused the write error using the verification data to output a result of the reproducing.

2. The method according to claim 1, wherein the verification data is created by including data for a first region, of the target object, containing a portion written prior to the portion that has caused the write error, among the plurality of portions, the data for a first region being data in which no pattern information is defined and by deleting data for a second region, of the target object, containing a portion written after the portion that has caused the write error.

3. The method according to claim 1, wherein the layout data is hierarchized into a plurality of internal constitutional units and
   data of one of the plurality of internal constitutional units containing the portion that has caused the write error is extracted as the part of the layout data.

4. The method according to claim 1, wherein the layout data is hierarchized into a plurality of internal constitutional units including a cell hierarchy constituted by at least one figure and
   wherein data of the cell hierarchy containing the portion that has caused the write error is extracted as the part of the layout data.

5. The method according to claim 1, wherein the layout data is hierarchized into a plurality of internal constitutional units containing a frame hierarchy generated by dividing a chip region into a plurality of regions in a thin rectangular shape and
   wherein data of the frame hierarchy containing the portion that has caused the write error is extracted as the part of the layout data.

6. The method according to claim 1, wherein data of a figure containing the portion that has caused the write error is extracted as the part of the layout data.

7. A creation apparatus for creating verification data to verify a write error after a write operation being started in a writing apparatus that forms a pattern on a target object based on layout data containing a figure pattern to be formed, comprising:

a selection unit configured to select a part of the layout data necessary for operation of a function that has caused the write error;

a data extraction unit configured to extract parts of the layout data corresponding to a selected part of the layout data from the layout data for all of a plurality of portions of the target object when a pattern indicated by the selected part of the layout data is arranged at the plurality of portions of the target object; and a verification data creation unit configured to create verification data by deleting at least one part extracted for at least one portion other than a portion that has caused the write error from among extracted parts of the layout data and by using remaining data.

8. The apparatus according to claim 7, wherein the apparatus inputs specification information for specifying the part of the layout data necessary for the operation of the function that has caused the write error and the data extraction unit extracts the parts of the layout data specified by the specification information from the layout data.

9. The apparatus according to claim 7, wherein the verification data is created by including data for a first region, of the target object, containing a portion written prior to the portion that has caused the write error, among the plurality of portions, the data for the first region being data in which no pattern information is defined, and by deleting data for a second region, of the target object, containing a portion written after the portion that has caused the write error.

10. The apparatus according to claim 7, wherein the layout data is hierarchized by a plurality of internal constitutional units and data of one of the plurality of internal constitutional units containing the portion that has caused the write error is extracted as the part of the layout data.

* * * * *